United States Patent [19]
Sakamoto et al.

[11] Patent Number: 6,151,220
[45] Date of Patent: Nov. 21, 2000

[54] MOUNTING STRUCTURE FOR ELECTRONIC PART

[75] Inventors: Akira Sakamoto; Kazuhiko Sera; Kazunari Oyama, all of Tokyo, Japan

[73] Assignee: Oki Electric Industry Co., Ltd., Tokyo, Japan

[21] Appl. No.: 09/092,892

[22] Filed: Jun. 8, 1998

[30] Foreign Application Priority Data

Jun. 30, 1997 [JP] Japan ............................... 9-189182

[51] Int. Cl.[7] ............................ H05K 1/18; H01L 23/48
[52] U.S. Cl. ........................ 361/773; 361/772; 361/783; 257/696; 257/723; 257/726; 29/832
[58] Field of Search ........................ 361/769, 772–774, 361/782, 783, 811, 820, 776, 789; 257/692, 693, 696, 726, 727, 780, 723, 724; 29/832, 854; 438/117; 439/65, 67, 493

[56] References Cited

U.S. PATENT DOCUMENTS

| | | | |
|---|---|---|---|
| 3,873,173 | 3/1975 | Anhalt | 361/769 |
| 4,595,794 | 6/1986 | Wasserman | 361/769 |
| 4,692,790 | 9/1987 | Oyamada | 257/727 |
| 4,895,523 | 1/1990 | Morrison et al. | 439/67 |
| 5,395,253 | 3/1995 | Crumly | 439/67 |
| 5,420,461 | 5/1995 | Mallik et al. | 361/769 |
| 5,433,631 | 7/1995 | Beaman et al. | 439/493 |
| 5,619,067 | 4/1997 | Sua et al. | 257/723 |

Primary Examiner—Jeffrey Gaffin
Assistant Examiner—John B. Vigushin
Attorney, Agent, or Firm—Rabin & Champagne, PC

[57] ABSTRACT

Leads 106 provided at an electronic part connectors 110 of an electronic part 100, which are electrically connected to a surface of a substrate 120 are structured in such a manner that they are directly connected to a substrate connector formed at the surface of the substrate 120 through a pressing force or a bonding force applied to the electronic part 100. This lead structure makes it possible to preclude the use of connectors including additional members such as contact pins, to achieve a reduction in the length of the communicating path of the electrical signals, and in addition, since electrical connection is achieved at one location, i.e., between the leads 106 and the substrate connector at the substrate 120, the contact resistance is minimized.

8 Claims, 23 Drawing Sheets

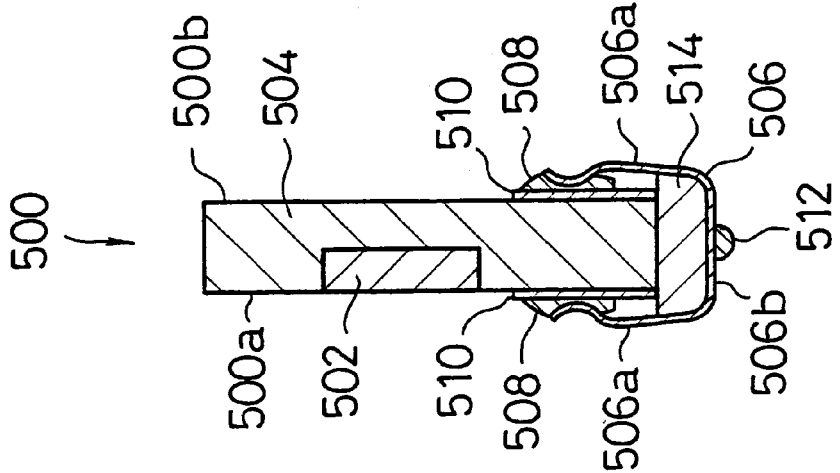
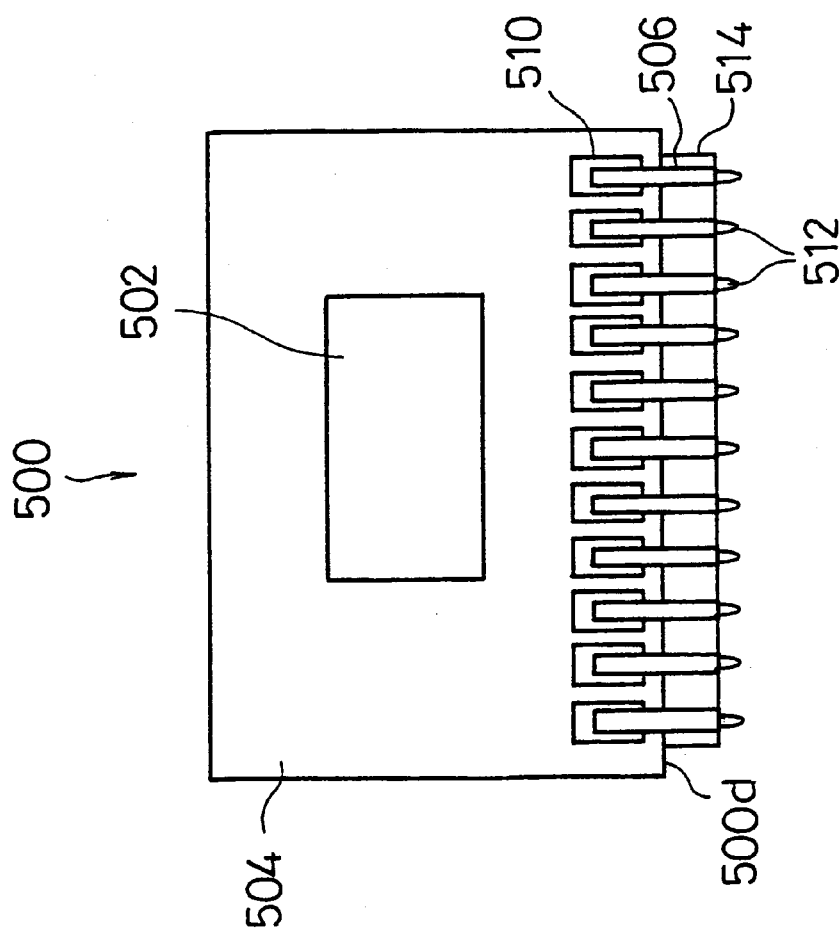

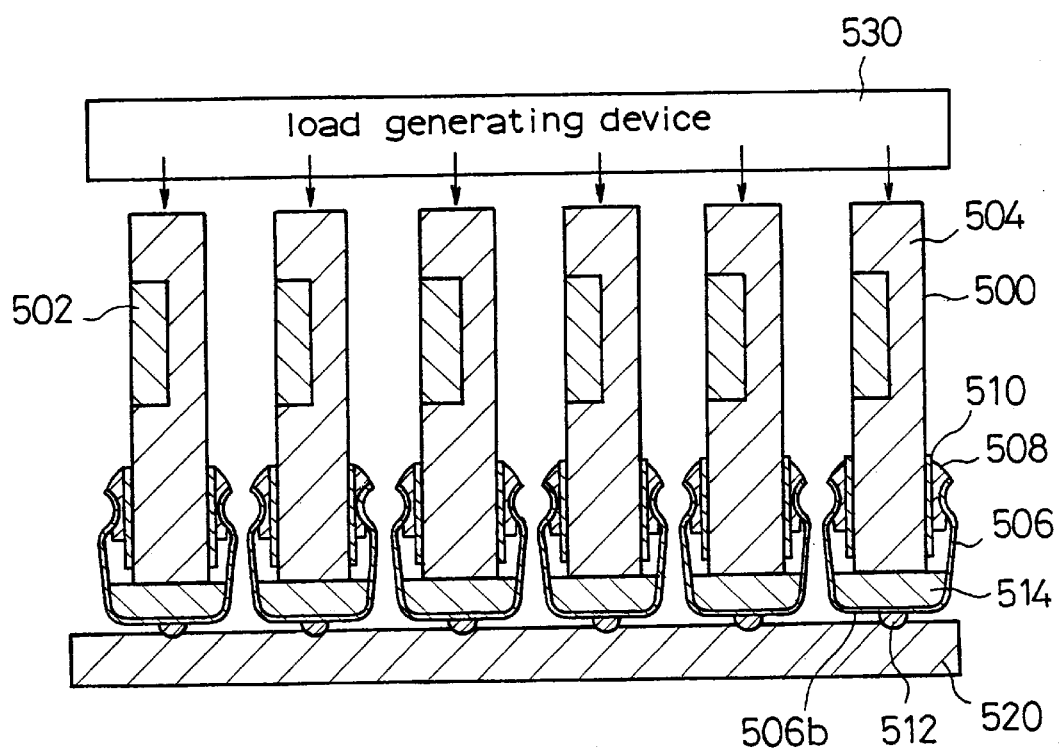

FIG. 9(a)
FIG. 9(b)
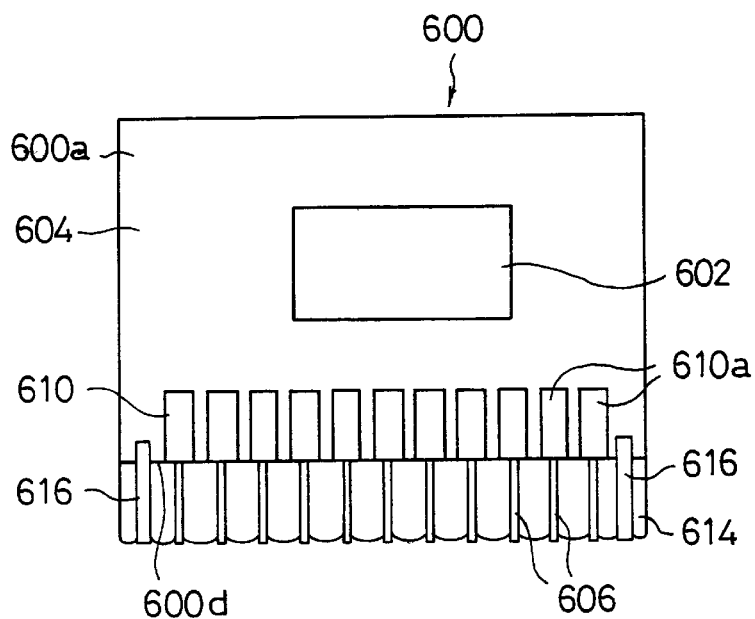
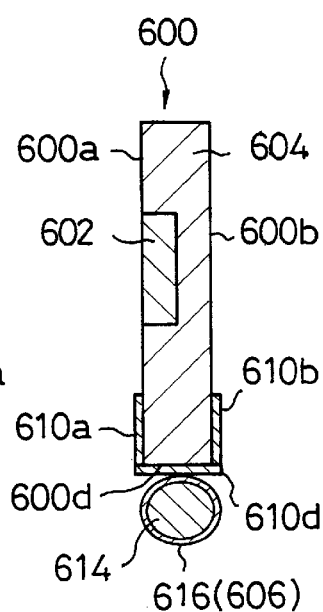
FIG. 9(c)
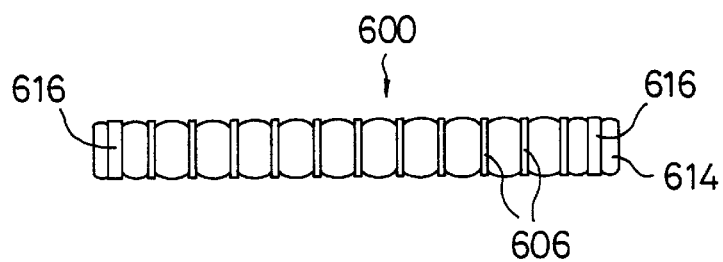

FIG. 25(a)
FIG. 25(b)
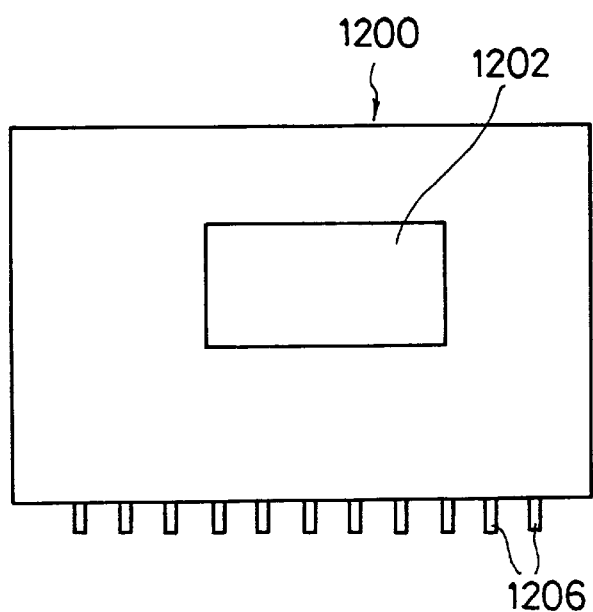
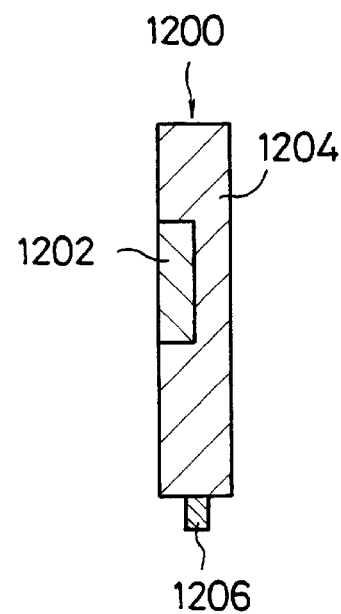
FIG. 25(c)
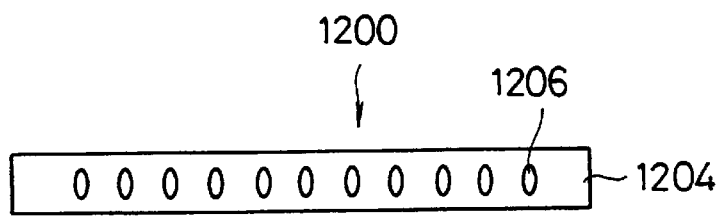

MOUNTING STRUCTURE FOR ELECTRONIC PART

BACKGROUND OF THE INVENTION

The present invention relates to a mounting structure for an electronic part, and in particular, it relates to a structure for mounting an electronic part such as a semiconductor package at an electrical connector such as a wiring formed on a substrate surface.

Inside an electronic device, an electrical circuit is constituted by mounting a number of different types of electronic parts on a surface of a substrate where various wirings are formed to achieve miniaturization of the electronic device and a higher density in the electronic device. It is to be noted that in this specification, the term "electronic part" refers to a part achieved through packaging various types of electronic elements that can be electrically operated, including integrated semiconductor elements such as various types of transistors and memories, circuit elements such as resistors and capacitors and optical elements such as light modulators, laser diodes and light amplifiers, by sealing them with a sealant such as resin, and is usually mounted at a substrate for use.

Such an electronic part may be mounted at various types of substrates in such a manner that the internal electronic elements are electrically driven. The electronic part is mounted at a substrate by electrically connecting a plurality of leads formed at a surface of the electronic part that are connected to an electrical connector (hereafter referred to as an electronic part connector) to achieve electrical connection of the electronic elements to an electrical connector (hereafter referred to as a substrate connector) such as a wiring formed at a surface of the substrate, in reference to FIGS. 28 and 29.

The following is an explanation of an example of a structure for mounting an electronic part in the prior art, i.e., a semiconductor package having an SVP (surface vertical package) structure at a substrate.

First, in reference to FIG. 28, a schematic structure of the electronic part having the SVP structure is explained. FIG. 28(a) is a front view of an SVP10, whereas FIG. 28(b) presents a transverse cross section of the SVP10.

The SVP10 is formed as a rectangular hexahedron with two large area portions constituting the front and the rear of the SVP10 and four side surface portions that constitute the thickness of the SVP10. An integrated semiconductor element 12 is sealed by a sealant 14 constituted of ceramic or a glass epoxy resin in the SVP10 so that the semiconductor element is protected from an external force or the like. As shown in FIG. 28, a plurality of leads 16 project out from one side surface in the direction of its thickness of the SVP10, which formed as a roughly plate-shaped hexahedron. Every two leads 16 constitutes a pair and in each pair the leads 16 are bent alternately to the left and to the right. It is to be noted that the internal semiconductor element 12 and the individual leads 16 are connected with each other via a wiring (not shown).

FIG. 29 shows a state in which a plurality of SVP10 devices are mounted at a surface of a substrate 20. A plurality of connectors 22 are provided at the surface of the substrate 20, with each of the connectors 22 having a groove 24 for mounting an electronic part 10. In each groove 24, a contact pin 26, which is electrically connected to a substrate connector (not shown) formed at the substrate 20, is provided. When the electronic parts 10 are mounted, the individual electronic parts 10 are inserted in the grooves of the corresponding connectors 22 and electrical connection is achieved by placing the leads 16 and the contact pins 26 in electrical contact with each other.

Thus, by inserting the leads 16 formed at one side surface in the direction of the thickness of the roughly plate-shaped package of the SVP10 at the connector 22 of the substrate 20, the SVP10 can be mounted with the large area portions of the electronic part 10 oriented in the vertical direction.

However, since an electronic part in the prior art is mounted through connection with the wiring at the surface of the substrate via a contact pin, there is a problem in that the path through which an electrical signal is communicated is naturally long. In addition, since an electrical connection is achieved at two locations, i.e., between the leads and the contact pins and between the contact pins and the substrate connector formed at the surface of the substrate, there is a concern that contamination of the contact surfaces may result in increased contact resistance. Thus, problems such as a delay in electrical signals and increased noise are yet to be addressed in the mounting structure of electronic parts in the prior art.

SUMMARY OF THE INVENTION

An object of the present invention, which has been completed by addressing the problems discussed above of the mounting structure for electronic parts in the prior art, is to provide a new and improved mounting structure for an electronic part in which the length of the communicating path of an electrical signal extending between the substrate and the electronic part can be minimized when mounting the electronic part at the substrate.

Another object of the present invention is to provide a new and improved mounting structure for an electronic part in which the contact resistance at the connecting portion can be minimized when the electronic part is mounted at a substrate.

Yet another object of the present invention is to provide a new and improved mounting structure for an electronic part with which the mounting process through which an electronic part such as a semiconductor package is mounted at the substrate can be facilitated.

Yet another object of the present invention is to provide a new and improved mounting structure for an electronic part that achieves a connecting portion having strong resistance against contamination and outstanding durability against external force when mounting the electronic part at a substrate.

In order to achieve the objects described above, the mounting structure for an electronic part according to the present invention comprises a substrate, a substrate connector such as a wiring formed at a surface of the substrate, an electronic part connector formed at a surface of an electronic part, a plurality of leads that are electrically connected with the electronic part connector and a securing device that secures the leads at the substrate connector through a pressing force and/or a bonding force.

In this mounting structure, an electronic part such as a semiconductor package is mounted at the surface of the substrate through application of an external force by, for instance, pressing the electronic part with an appropriate jig or applying an appropriate load to the electronic part. Alternatively, the electronic part may be mounted at the surface of the substrate by bonding the substrate connector and the leads together with a conductive adhesive.

Thus, according to the present invention, by employing an appropriate securing device, the leads that are electrically connected to the electronic part connector of the electronic part are directly connected to the substrate connector at the substrate surface. Consequently, unlike the mounting structure in the prior art, this mounting structure precludes the necessity for forming a special connector part at the substrate and the necessity for providing additional parts such as contact pins, thereby making it possible to reduce the length of the communicating path of the electrical signal and since electrical connection can be achieved at only one location, i.e., between the leads and the substrate connector, the contact resistance can also be minimized.

It is to be noted that various different structures may be adopted to achieve the structure of the leads.

For instance, each lead may be constituted of a roughly U-shaped conductor, with both ends of the U-shaped lead electrically connected to the electronic part connector.

Alternatively, each lead may be constituted of a roughly L- shaped conductor, with one end of the L- shaped lead electrically connected to the electronic part connector.

In yet another alternative, each lead may be constituted of a roughly spherical conductor, with a portion of the spherical lead electrically connected with the electronic part connector.

Furthermore, each lead may be constituted of a conductor formed in a roughly pin shape with one end of the pin-shaped lead electrically connected to the electronic part connector. In addition, the pin-shaped leads may be electrically connected with the electronic part connector via an elastic member such as a spring that can stretch or contract freely.

Moreover, each lead may be constituted as a conductive sleeve formed at a surface of one or more buffer members having an insulating property provided between the lead and the package surface, with a portion of the sleeve-shaped lead electrically connected to the electronic part connector.

Furthermore, a plurality of buffer members may be provided between the electronic part connector and the inner surfaces of the individual leads to constitute pairs with the leads. In this structure, each lead may be constituted as a conductive sleeve formed at the surface of each buffer member, with a portion of the sleeve-shaped lead electrically connected with the electronic part connector. In addition, if this structure is adopted, it is desirable to link the buffer member assembly and the sleeve-shaped lead assembly to each other by employing a reinforcing member.

Alternatively, one buffer member which is constituted by alternately providing a plurality of conductive layers and a plurality of insulating layers may be provided between the electronic part connector and the inner surfaces of the leads. In this structure, the individual conductive layers correspond to the individual leads.

It is to be noted that if it is structurally possible, a protruding electrode may be provided at a surface of each lead where it comes in contact with the substrate connector in the various structures described above or the leads and the substrate connector may be bonded with a conductive bonding material in the various structures described above, in order to improve the contact between the individual leads and the substrate connector. Alternatively, in order to attenuate external force applied to the electronic part and the substrate, one or more buffer members having an insulating property may be provided between the leads and the package surface in the various structures described above.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

In the drawings:

FIG. 7 illustrates an example of the electronic part in a fourth embodiment of the present invention, with FIG. 7(a) presenting a front view of the electronic part and FIG. 7(b) presenting a transverse cross section of the electronic part;

FIG. 8 illustrates a state in which a plurality of the electronic parts in the fourth embodiment are mounted at a substrate surface;

FIG. 9 illustrates an example of the electronic part in a fifth embodiment of the present invention, with FIG. 9(a) presenting a front view of the electronic part, FIG. 9(b) presenting a transverse cross section of the electronic part and FIG. 9(c) presenting a bottom view of the electronic part;

FIG. 25 illustrates an example of the electronic part in an eleventh embodiment of the present invention, with FIG. 25(a) presenting a front view of the electronic part, FIG. 25(b) presenting a transverse cross section of the electronic part and FIG. 25(c) presenting a bottom view of the electronic part;

DETAILED DESCRIPTION OF THE PREFERRED EMBODIMENTS

Figure 1B:
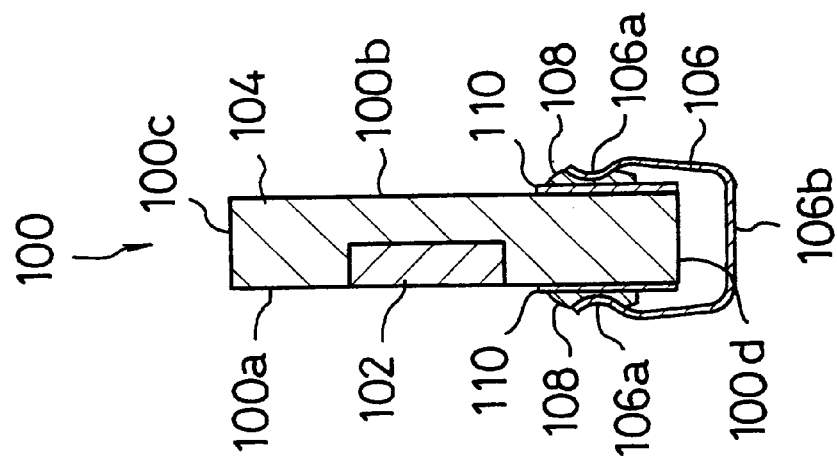
FIG. 1 illustrates an example of the electronic part in a first embodiment of the present invention, with FIG. 1(a) presenting a front view of the electronic part and FIG. 1(b) presenting a transverse cross section of the electronic part.

The following is a detailed explanation of several preferred embodiment of the mounting structure for an electronic part according to the present invention.
First Embodiment FIG. 1 shows a semiconductor package having an SVP structure as an example of the electronic part in the first embodiment of the present invention, with FIG. 1(a) presenting a front view of the semiconductor package 100 and FIG. 1(b) presenting a transverse cross section of the semiconductor package 100.

The semiconductor package 100 is internally provided, as appropriate, with a semiconductor chip 102 achieved by integrating specific electronic circuits, with the semiconductor chip 102 sealed with a sealing material 104 such as ceramic, epoxy resin or the like so that it can be protected from external force and the like. The semiconductor package 100 is formed as a roughly rectangular hexahedron with two larger area portions (100a, 100b) constituting its front and rear, and four side surface portions (100c, 100d, 100e, 100f) constituting the thickness of the package. In the example illustrated in the figures, a plurality of electronic part connectors (hereafter also referred to as terminals) 110, that are electrically connected with the internal semiconductor chip 102 are arrayed in the lower areas of the two large area portions 100a and 100b (at the side where the semiconductor package 100 is mounted at a substrate).

In addition, at the lower portion of the semiconductor package 100, leads 106 are mounted in correspondence to the individual terminals 110. In the semiconductor package 100 in the first embodiment, the leads 106 are each formed to achieve a roughly U shape as a whole by using a conductive material such as a metal.

Figure 1A:
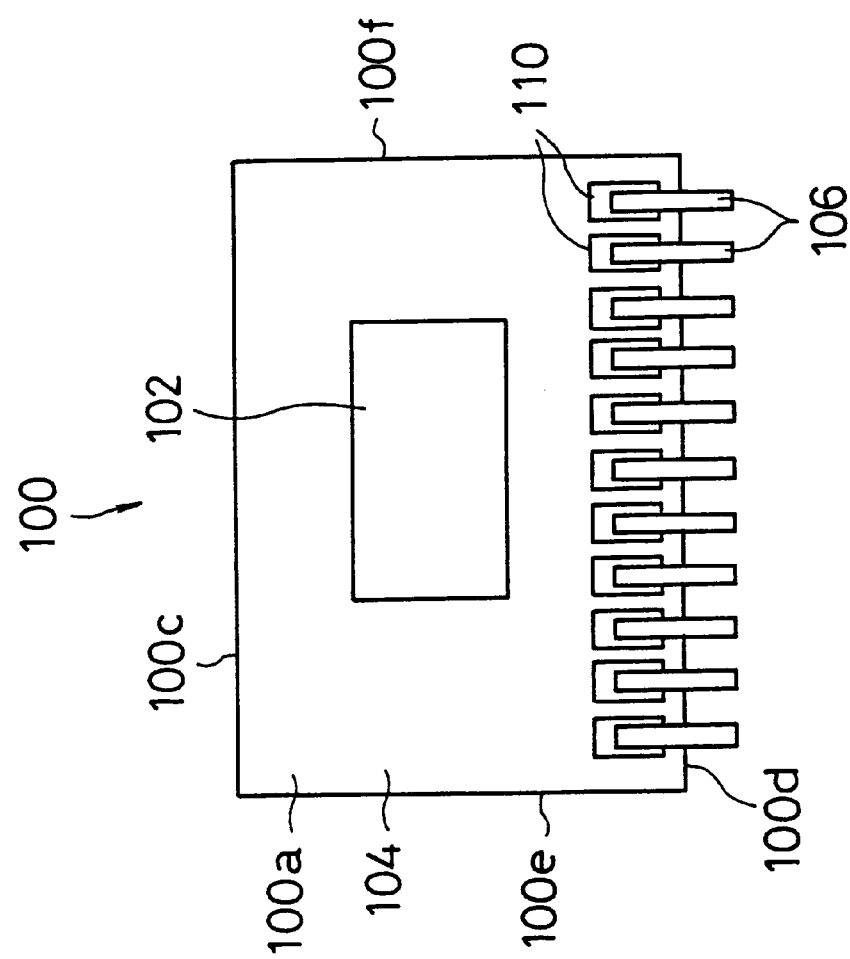

As shown in FIG. 1(b), two end portions 106a of each lead 106 are electrically connected to the terminals 110 provided at the front side surface and the rear side surface of the semiconductor package 100 via a conductive substance 108 such as solder, conductive resin or the like. In addition, the area between the two end portions 106a of each U-shaped lead 106 provided at a distance from the bottom surface 100d of the semiconductor package 100 is constituted as a conductive portion 106b to be electrically connected to a substrate connector (not shown) such as a wiring formed at a surface of a substrate 120 which is to be detailed next.

Figure 2:
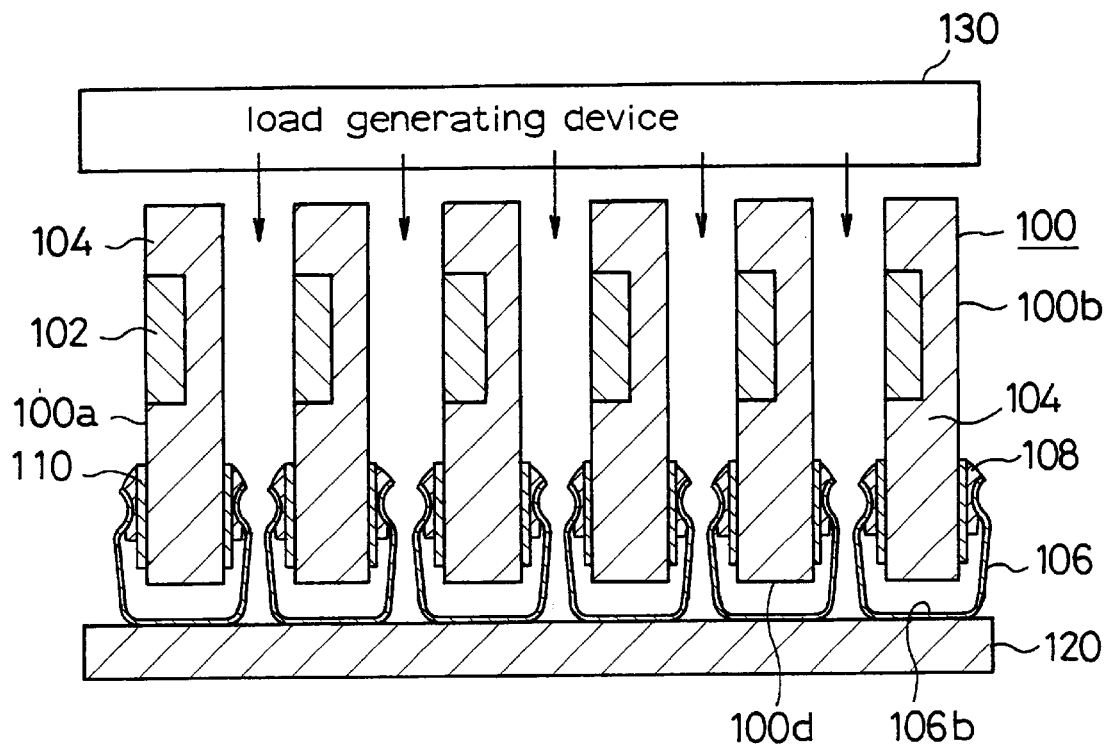
FIG. 2 illustrates a state in which a plurality of electronic parts in the first embodiment are mounted at a substrate surface.

FIG. 2 illustrates a state in which a plurality of the semiconductor packages 100 in the first embodiment are mounted at a surface of the substrate 120. The substrate 120 may be constituted by forming substrate connectors (not shown) such as a desired wiring pattern of conductive material applied on the surface of a plate member constituted of an insulating material such as, for instance, ceramic, glass epoxy resin or the like.

When mounting the semiconductor packages 100 at the substrate 120, a load generating device 130 that generates an external force to press the conductive portion 106b of each U-shaped lead 106 against the substrate connector at the substrate 120 as illustrated in FIG. 2 is employed. The structure of the load generating device 130 can be selected from various different structures such as a structure in which an appropriate jig is screwed to the substrate, a structure in which a weight is placed on top and the like. Alternatively, a substrate that generates an external force to be applied to the semiconductor package 100 during the mounting process may be employed to fulfill a dual role as a substrate and as a load generating device 130.

Thus, as indicated by the arrows in the figure, the load generating device 130 applies a downward external force to the semiconductor packages 100 to press them against the surface of the substrate 120 to mount the semiconductor packages 100 at the surface of the substrate 120 with the conductive portions 106b of the individual leads 106 directly connected to the substrate connector, such as a wiring formed at the surface of the substrate 120. It is to be noted that during the mounting process, the substrate connectors and the individual leads 106 may be bonded with a conductive adhesive to improve stability.

As has been explained, since the leads 106 of the semiconductor package 100 in the first embodiment can be directly connected to the substrate connector at the surface of the substrate 120, it is not necessary to form a relay member such as a contact pin, as is required in the prior art, on the substrate. In addition, since no relay member such as a contact pin is required, the communicating path of electrical signals can be shortened. Furthermore, since an electrical connection can be achieved at one location, i.e., between the conductive portion 106b of each lead 106 and the substrate connector such as a wiring formed at the surface of the substrate 120, the contact resistance is reduced. As a result, problems such as a delay of the electrical signals and increased noise can be avoided.

In addition, by forming the leads 106 in a rough U-shape, the electrical connection between the conductive portions 106b and the wiring at the surface of the substrate 120 can be easily achieved simply by applying a downward external force to the semiconductor package 100 to press it against the surface of the substrate 120 with the load generating device 130. Thus, semiconductor packages 100 can be densely mounted at the surface of the substrate 120 to achieve a larger capacity. It is to be noted that the conductive portions 106b and the substrate connector such as a wiring formed at the surface of the substrate 120 may be electrically connected by using a conductive substance such as, for instance, solder, conductive resin or the like.

Second Embodiment

Figure 3:
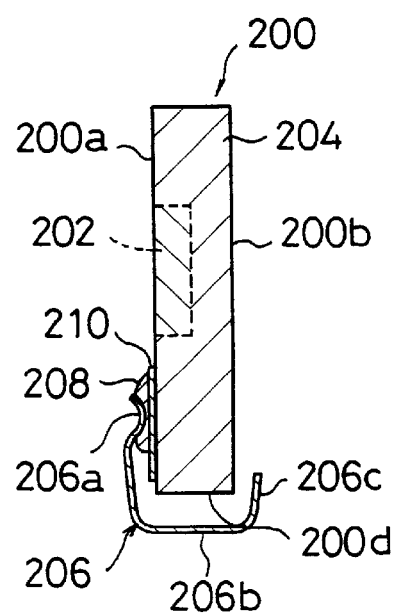
FIG. 3 is a transverse cross section illustrating the electronic part in a second embodiment of the present invention.

FIG. 3 is a transverse cross section illustrating a semiconductor package 200 in the second embodiment of the present invention.

This semiconductor package 200 also has a rectangular hexahedron structure (200a–200d) achieved by sealing an electronic element 202 with a sealant 204, as in the case with the previous semiconductor package 100. However, in the semiconductor package 200, terminals 210 for inputting and outputting electrical signals for the electronic element 202 are provided in the lower portion of only one of the large area portions, i.e., the large area portion 200a of the semiconductor package 200, unlike in the first embodiment.

In addition, in the semiconductor package 200 in the second embodiment, leads 206 are each formed to achieve a roughly L shape or a roughly J shape as a whole, using a conductive material such as a metal. Then, a longitudinal side 206a of each lead 206 formed in a roughly L shape is electrically connected to a terminal 206 at the side surface of the semiconductor package 200 via a conductive substance 208, with the other side constituted as a conductive portion 206b for achieving an electrical connection with the wiring at the substrate surface. Furthermore, while a front end portion 206c of the L-shaped lead 206 is bent upward in the example illustrated in the figure, it goes without saying that this bend can be omitted. It is to be noted that since other structural features are similar to those in the semiconductor package 100 in the first embodiment explained earlier in reference to FIGS. 1 and 2, their detailed explanation is omitted.

This semiconductor package 200 in the second embodiment, too, can be mounted at the substrate surface by applying a downward external force to the semiconductor package 200 to press it against the surface of the substrate with a load generating device, as in the case of the semiconductor package 100 in the first embodiment explained earlier, with the conductive portion 206b of the lead 206 directly connected to the substrate connector at the substrate surface. It is to be noted that during the mounting process, the substrate connector and the individual leads 206 may be bonded using a conductive adhesive to improve stability.

Since this structure makes it possible to mount the semiconductor package 200 on the substrate without having to employ contact parts including additional parts such as contact pins, as in the prior art, the length of the communicating path of the electrical signals can be reduced and the contact resistance, too, can be reduced. Consequently, problems such as a delay of the electrical signals and increased noise can be avoided. In addition, the semiconductor packages 200 can be mounted easily at high density to realize a larger capacity.

Third Embodiment

Figure 4B:
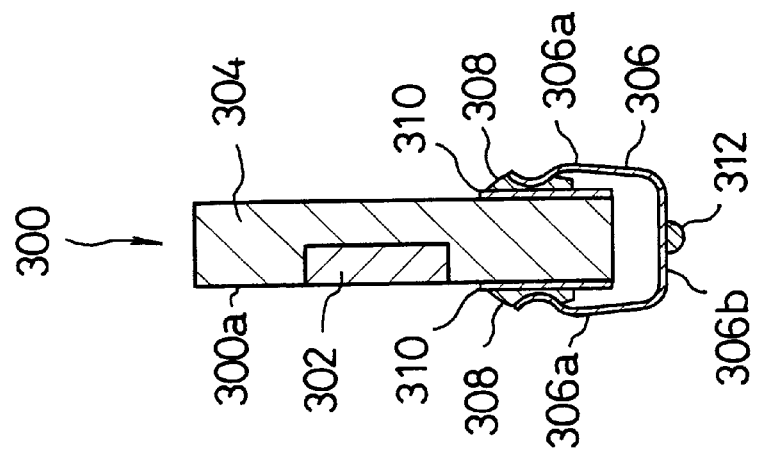
FIG. 4 illustrates an example of the electronic part in a third embodiment of the present invention, with FIG. 4(a) presenting a front view of the electronic part and FIG. 4(b) presenting a transverse cross section of the electronic part.
Figure 4A:
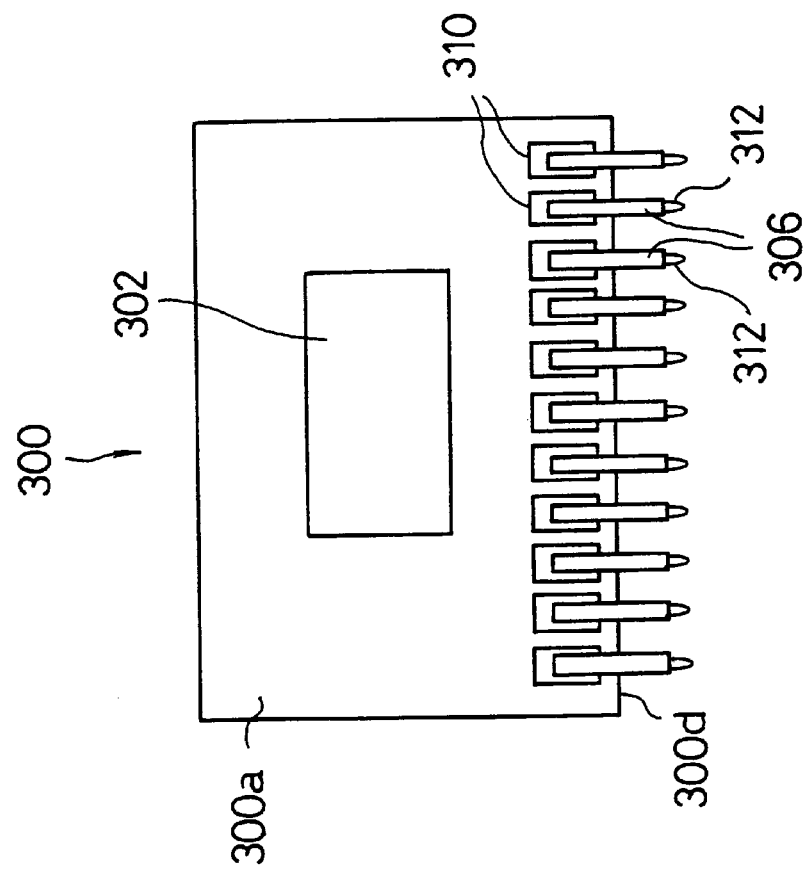
Figure 5:
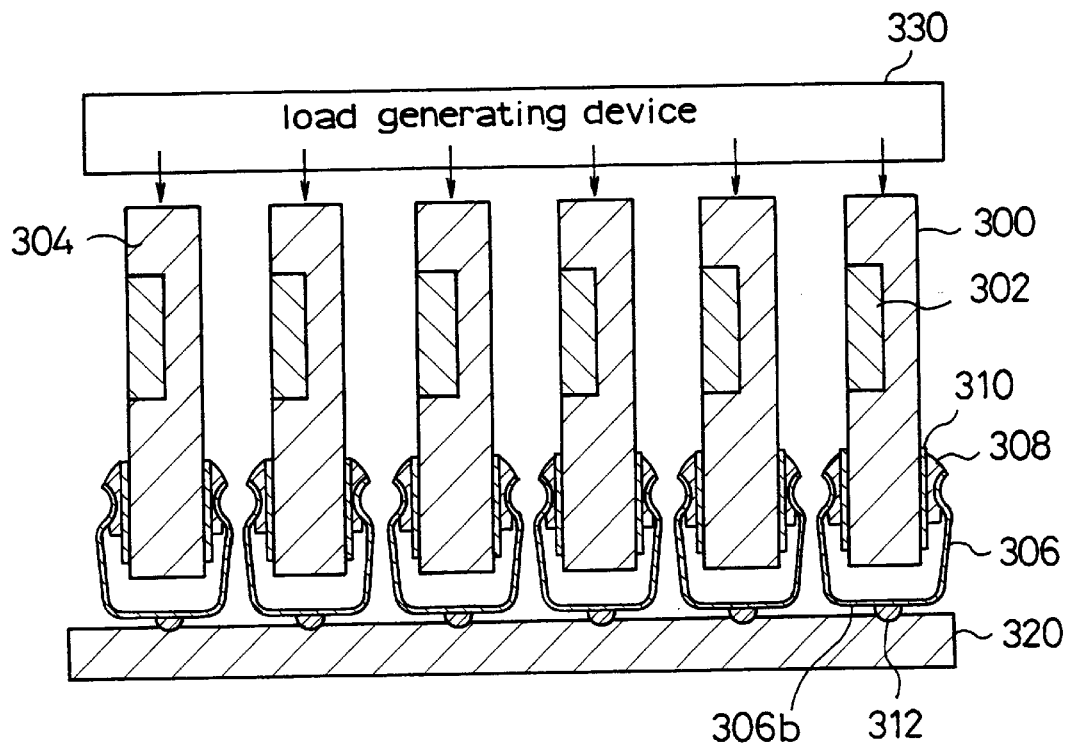
FIG. 5 illustrates a state in which a plurality of the electronic parts in the third embodiment are mounted at a substrate surface.

FIG. 4 shows a semiconductor package 300 in the third embodiment of the present invention, with FIG. 4(a) presenting a front view of the semiconductor package 300 and FIG. 4(b) presenting a transverse cross section of the semiconductor package 300. FIG. 5 illustrates a state in which a plurality of the semiconductor packages 300 in the third embodiment are mounted at a surface of a substrate 320.

This semiconductor package 300, too, is a rectangular hexahedron (300a–300d) achieved by sealing an electronic element 302 with a sealant 304. In addition, in the semiconductor package 300, leads 306 are each formed in a roughly U shape as a whole using a conductive material such as a metal, as in the semiconductor package 100 in the first embodiment explained earlier in reference to FIGS. 1 and 2. Two end portions 306a of each lead 306 are electrically connected to terminals 310 provided at the front and rear side surfaces of the semiconductor package 300 respectively through a conductive line substance 308, with the area between the two end portions 306a of each lead 306 constituted as a conductive portion 306b to be electrically connected to a wiring at the surface of the substrate 320 shown in FIG. 5 by a load generating device 330.

However, in the semiconductor package 300 in the third embodiment, an electrode 312 formed to protrude at the outer surface of the conductive portion 306b of each lead 306 is provided. This electrode 312 may be achieved by adopting a method in which the conductive portion 306b of the lead 306 is mechanically struck outward with a punch or the like, a method in which a conductive substance (for instance, gold, silver, copper, solder or the like) is placed to adhere at the outer surface of the conductive portion 306b of the lead 306 to form the electrode 312, a method in which the electrode 312 is formed at the outer surface of the conductive portion 306b by molding the entire lead 306 with a conductive material or the like. It is to be noted that since the other structural features are similar to those in the semiconductor package 100 in the first embodiment, explained earlier in reference to FIGS. 1 and 2, their explanation is omitted.

The semiconductor package 300 in the third embodiment is mounted at the surface of the substrate 320 by applying a downward external force to the semiconductor package 300 to press it against the surface of the substrate 320 with a load generating device 330 such as an appropriate jig, with the electrodes 312 provided at the conductive portions 306b of the individual leads 306 directly connected to the substrate connector such as a wiring at the surface of the substrate 320. It is to be noted that during the mounting process, the substrate connector and the individual leads 306 may be bonded using a conductive adhesive to improve stability.

Since this structure makes it possible to mount the semiconductor package 300 on the substrate without having to employ contact parts including additional parts such as contact pins as in the prior art, the length of the communicating path of the electrical signals can be reduced and the contact resistance, too, can be reduced. Consequently, problems such as a delay of the electrical signals and increased noise can be avoided. In addition, the semiconductor package 300 can be mounted easily at high density to realize a larger capacity.

Furthermore, since the electrodes 312 of the semiconductor package 300 in the third embodiment are directly connected to the substrate connector at the surface of the substrate 320, the contact resistance can be further reduced.

Fourth Embodiment

Figure 6:
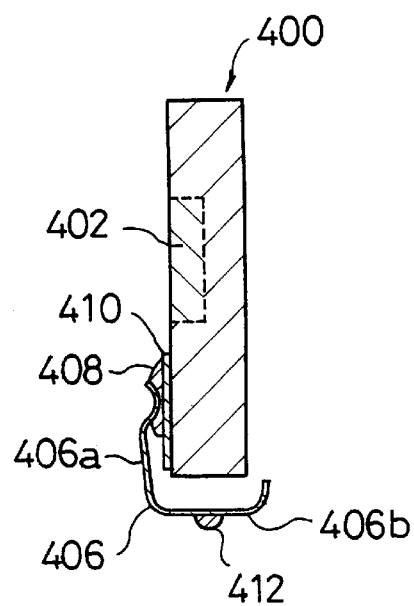
FIG. 6 is a transverse cross section illustrating the electronic part whose leads are formed in a roughly L shape in the third embodiment.

The structure of a semiconductor package 400 in the fourth embodiment is illustrated in FIG. 6. The semiconductor package 400 in the fourth embodiment is achieved by adding modifications that are similar to those made in the semiconductor package 200 in the second embodiment, to the semiconductor package 300 in the third embodiment. Namely, in the semiconductor package 400 in the fourth embodiment, terminals 410 connected to a semiconductor chip 402 are provided in the lower area of only one surface of the semiconductor package 400, with one of the sides, i.e., the longitudinal side 406a of each lead 406 formed to achieve a rough L shape as a whole connected to a terminal 410 via a conductive substance 408 and a side 406b located toward the bottom relative to the longitudinal side 406a constituted as the portion to be electrically connected to the wiring at the substrate surface. In addition, by forming an electrode 412 at the outer surface of the conductive portion 406b, advantages similar to those achieved in the semiconductor package 300 in the third embodiment explained in reference to FIGS. 4 and 5 can be achieved.

Fifth Embodiment

FIG. 7 illustrates a semiconductor package 500 in the fifth embodiment of the present invention, with FIG. 7(a) presenting a front view of the semiconductor package 500 and FIG. 7(b) presenting a transverse cross section of the semiconductor package 500. FIG. 8 illustrates a state in which a plurality of the semiconductor packages 500 in the fifth embodiment are mounted at the surface of a substrate 520.

In the semiconductor package 500, too, leads 506 are each formed in a roughly U shape as a whole using a conductive material such as a metal, as in the semiconductor package 100 in the first embodiment explained earlier in reference to FIGS. 1 and 2. Two end portions 506a of each lead 506 are electrically connected to terminals 510 formed in the lower area of the two large area portions 500a and 500b via a conductive substance 520 with the area between the two end portions 506a of each lead 506 constituted as a conductive portion 506b to be electrically connected to a substrate connector (not shown) at the surface of the substrate 520 shown in FIG. 8.

However, in the semiconductor package 500 in the fifth embodiment, a buffer member 514 is provided between the bottom surface 500d of the semiconductor package 500 and the inner surfaces of the conductive portions 506b of the individual leads 506. In the example illustrated in the figures, a buffer member 514 constituted of an insulating rubber, a silicone rubber or the like is placed between the bottom surface 500d of the semiconductor package 500 and the inner surface of the conductive portion 506b of the leads 506. In addition, as in the semiconductor package 300 in the third embodiment explained earlier in reference to FIGS. 4 and 5, an electrode 312 formed in a protruding shape is provided at the outer surface of the conductive portion 306b of each lead 306. It is to be noted that since other structural features are similar to those in the semiconductor package 100 in the first embodiment explained earlier in reference to FIGS. 1 and 2, their detailed explanation is omitted.

The semiconductor package 500 in the fifth embodiment, too, is mounted at the surface of the substrate 520 by applying a downward external force to the semiconductor package 500 to press it against the surface of the substrate 520 with a load generating device 530 during the mounting process with the electrodes 512 provided at the conductive portions 506b of the individual leads 506 directly connected to the substrate connector such as a wiring at the surface of the substrate 520. It is to be noted that during the mounting process, the substrate connector and the individual leads 506 may be bonded using a conductive adhesive to improve stability.

Since this structure makes it possible to mount the semiconductor package 500 on the substrate without having to employ contact parts including additional parts such as contact pins, as required in the prior art, the length of the communicating path of the electrical signals can be reduced and the contact resistance, too, can be reduced. Consequently, problems such as a delay of the electrical signals and increased noise can be avoided. In addition, the semiconductor packages 500 can be mounted easily at high density to realize a larger capacity.

In addition, since the electrodes 512 are connected to the substrate connector at the surface of the substrate 520, the contact resistance can be further reduced. Furthermore, since the external force applied to the semiconductor package 500 by the load generating device 530 when mounting the semiconductor package 500 at the surface of the substrate 520 is absorbed by the buffer member 514 in the semiconductor package 500 in the fifth embodiment, the semiconductor package 500 and the substrate 520 can be prevented from becoming damaged.

Moreover, by attenuating the external force applied to the semiconductor package 500 by absorbing it with the buffer member 514, it becomes possible to electrically connect the individual electrodes 512 to the substrate connector (not shown) such as a wiring formed at the surface of the substrate 520 with an even force.

Sixth Embodiment

FIG. 9 illustrates a semiconductor package 600 in the sixth embodiment of the present invention, with FIG. 9(a) presenting a front view of the semiconductor package 600, FIG. 9(b) presenting a transverse cross section of the semiconductor package 600 and FIG. 9(c) presenting a bottom view of the semiconductor package 600.

Figure 10:
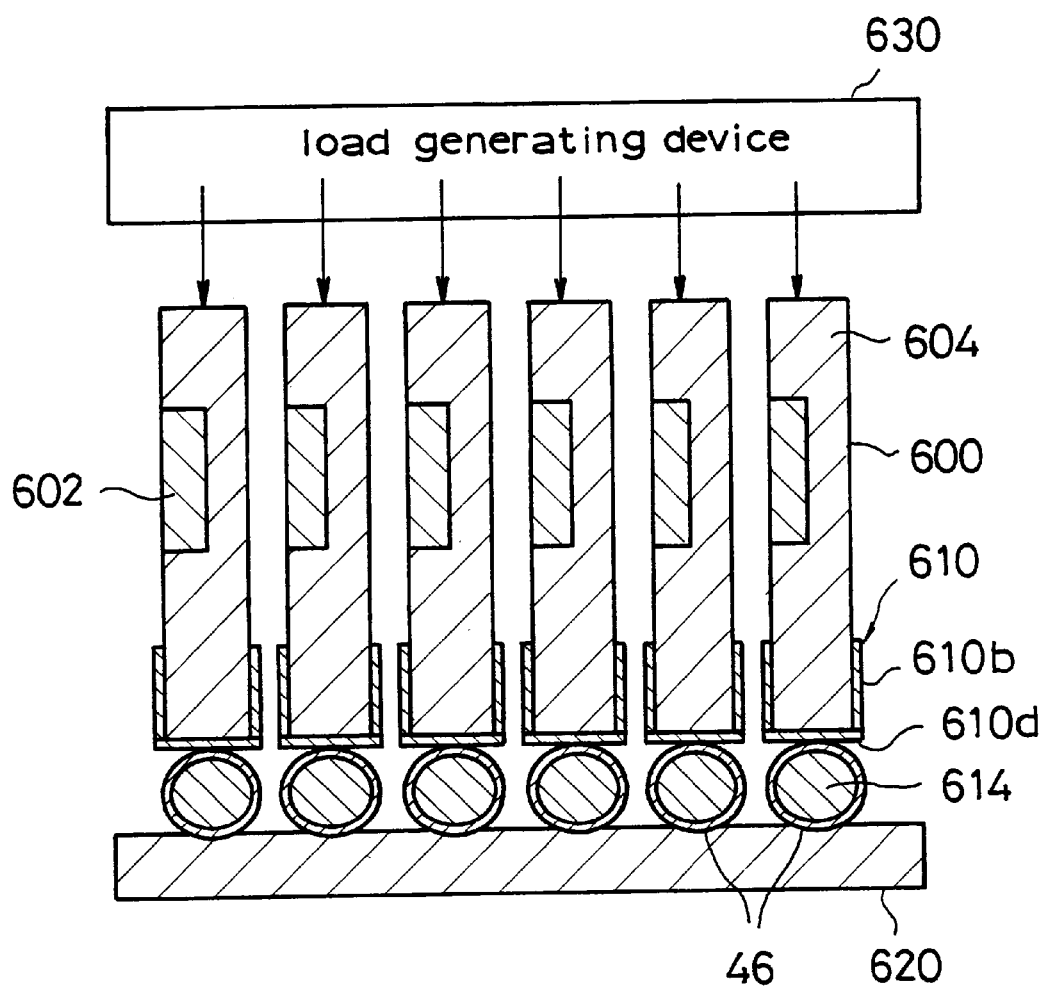
FIG. 10 illustrates a state in which a plurality of the electronic parts in the fifth embodiment are mounted at a substrate surface.

FIG. 10 illustrates a state in which a plurality of the semiconductor packages 600 in the sixth embodiment are mounted at a surface of a substrate 620. A plurality of terminals 610 for inputting and outputting electrical signals for various electronic elements 602 sealed at the semiconductor package 600 with a sealant 604 are provided at the bottom surface 600d of the semiconductor package 600. It is to be noted that in the example illustrated in the figures, the terminals 610 are each formed in a U shape to cover the lower end 600d of the semiconductor package 600 and are each constituted of lateral side portions 610a and 610b located at large area portions 600a and 600b respectively of the semiconductor package 600 and a bottom side portion 610d that covers the lower end 600d of the semiconductor package 600.

In addition, a cylindrically-shaped buffer member 614 constituted of insulating rubber, silicone rubber or the like is mounted through bonding achieved by securing fixtures 616 at the bottom surface 600d of the semiconductor package 600. At the surface of the buffer member 614, conductive sleeves 606 which are formed in a ring shape and function as leads are provided in correspondence to the individual terminals 610, and a portion of each conductive sleeve 610 is electrically connected with the bottom side portion 610d of a terminal 610 provided at the bottom surface 600d of the semiconductor package 600. The conductive sleeves 610 are each achieved by placing and securing a conductive substance such as copper, silver, gold or the like onto a flexible insulating substance such as a polyimide tape and pasting the assembly onto the external circumference of the buffer member 614. It is to be noted that since other structural features are similar to those in the semiconductor package 100 in the first embodiment explained earlier in reference to FIGS. 1 and 2, their detailed explanation is omitted.

The semiconductor package 600 in the sixth embodiment, too, is mounted at the surface of the substrate 620 by applying a downward external force to the semiconductor package 600 to press it against the surface of the substrate 620 with a load generating device 630 with the conductive sleeves 606 directly connected to the substrate contact (not shown) such as a wiring at the surface of the substrate 620. It is to be noted that during the mounting process, the substrate connector and the individual leads 606 may be bonded using a conductive adhesive to improve stability.

Since this structure makes it possible to mount the semiconductor package 600 on the substrate without having to employ contact parts including additional parts such as contact pins, as required in the prior art, the length of the communicating path of the electrical signals can be reduced and the contact resistance, too, can be reduced. Consequently, problems such as a delay of the electrical signals and increased noise can be avoided. In addition, the semiconductor package 600 can be mounted easily at high density to realize a larger capacity.

Furthermore, since the external force applied to the semiconductor package 600 in the sixth embodiment by the load generating device 630 when mounting the semiconductor package 600 at the surface of the substrate 620 is absorbed by the buffer member 614, the semiconductor package 600 and the substrate 620 can be prevented from becoming damaged. Moreover, by attenuating the external force applied to the semiconductor package 600 by absorbing it with the buffer member 614, it becomes possible to electrically connect the individual conductive sleeves 606 to the substrate connector (not shown) such as a wiring formed at the surface of the substrate 620 with an even force.

Seventh Embodiment

Figure 11A:
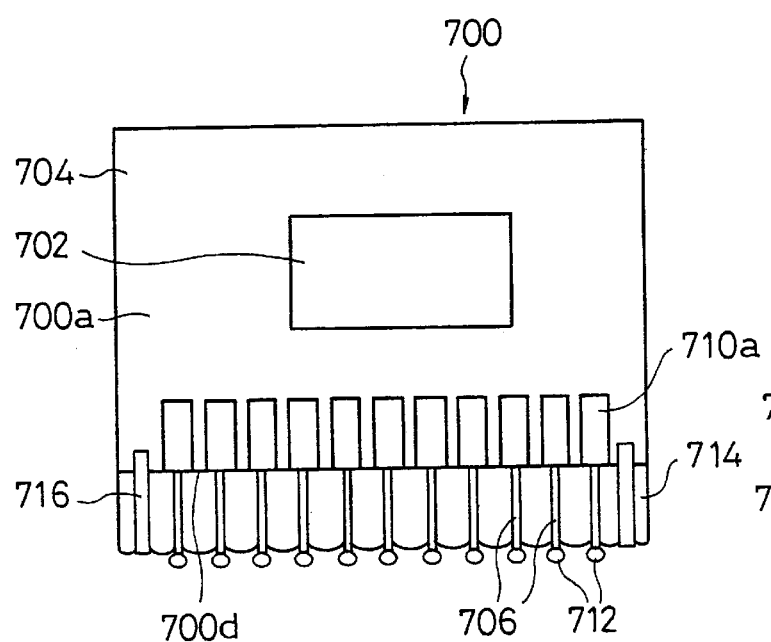
FIG. 11 illustrates an example of the electronic part in a sixth embodiment of the present invention, with FIG. 11(a) presenting a front view of the electronic part, FIG. 11(b) presenting a transverse cross section of the electronic part and FIG. 11(c) presenting a bottom view of the electronic part.
Figure 11B:
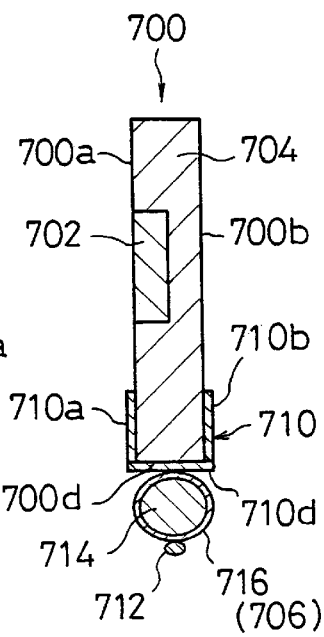
Figure 11C:
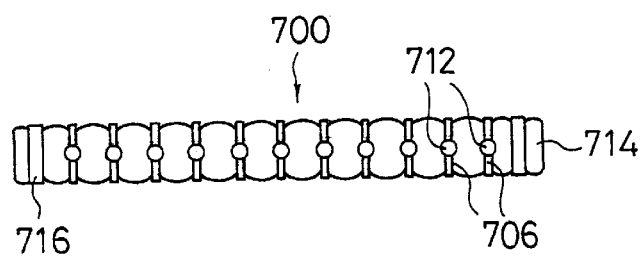
Figure 12:
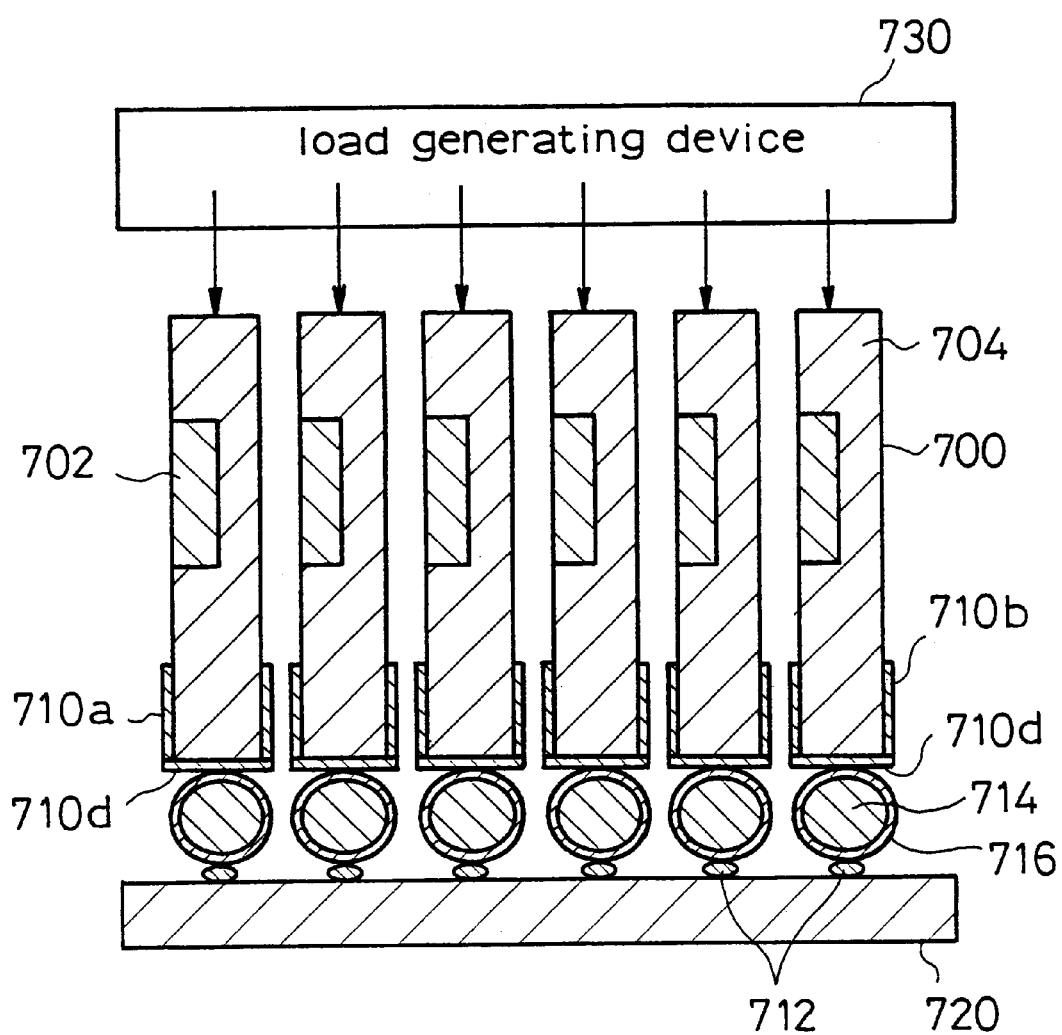
FIG. 12 illustrates a state in which a plurality of the electronic parts in the sixth embodiment are mounted at a substrate surface.

FIG. 11 illustrates a semiconductor package 700 in the seventh embodiment of the present invention, with FIG. 11(*a*) presenting a front view of the semiconductor package 700, FIG. 11(*b*) presenting a transverse cross section of the semiconductor package 700 and FIG. 11(*c*) presenting a bottom view of the semiconductor package 700. FIG. 12 illustrates a state in which a plurality of the semiconductor packages 700 in the seventh embodiment are mounted at a surface of a substrate 720.

In this semiconductor package 700, too, as in the semiconductor package 600 in the sixth embodiment explained earlier in reference to FIGS. 9 and 10, a plurality of terminals 710 for inputting and outputting electrical signals for various electronic elements 702 sealed at the semiconductor package 700 with a sealant 704 are provided at a bottom surface 700*d* of the semiconductor package 700. The terminals 710 are each formed in a U shape to cover the lower end 700*d* of the semiconductor package 700 and are each constituted of lateral side portions 710*a* and 710*b* located at large area portions 700*a* and 700*b* respectively of the semiconductor package 700 and a bottom side portion 710*d* that covers the lower end 700*d* of the semiconductor package 700.

In addition, a cylindrically-shaped buffer member 714 constituted of an insulating rubber, a silicone rubber or the like is mounted through bonding achieved by securing fixtures 716 at the bottom surface 700*d* of the semiconductor package 700. At the surface of the buffer member 714, conductive sleeves 706 which are formed in a ring shape and function as leads are provided in correspondence to the individual terminals 710, and a portion of each conductive sleeve 710 is electrically connected with the bottom side portion 710*d* of each terminal 710 provided at the bottom surface 700*d* of the semiconductor package 700. The conductive sleeves 706 are each achieved by placing and securing a conductive substance such as copper, silver, gold or the like onto a flexible insulating substance such as a polyimide tape and pasting the assembly on the external circumference of the buffer member 714. It is to be noted that since other structural features are similar to those in the semiconductor package 600 in the sixth embodiment explained earlier in reference to FIGS. 9 and 10, their detailed explanation is omitted.

However, in the semiconductor package 700 in the seventh embodiment, an electrode 712 formed to protrude at a side surface of each conductive sleeve 706. This electrode 712 may be achieved by adopting a method in which a portion of the conductive sleeve 706 is mechanically struck outward with a punch or the like, a method in which a conductive substance, (for instance, gold, silver, copper, solder or the like) is placed to adhere at the side surface of the conductive sleeve 706 to form the electrode 712 or the like. It is to be noted that since the other structural features are similar to those in the semiconductor package 100 in the first embodiment explained earlier in reference to FIGS. 1 and 2, and the semiconductor package 600 in the sixth embodiment explained earlier in reference to FIGS. 9 and 10, their detailed explanation is omitted.

The semiconductor package 700 in the seventh embodiment, too, is mounted at the surface of the substrate 720 by applying a downward external force to the semiconductor package 700 to press it against the surface of the substrate 720 with a load generating device 730 such as an appropriate jig, with the conductive sleeves 706 directly connected to the wiring at the surface of the substrate 720. It is to be noted that during the mounting process, the substrate connector and the individual leads 706 may be bonded using a conductive adhesive to improve stability.

Since this structure makes it possible to mount the semiconductor package 700 on the substrate without having to employ contact parts including additional parts such as contact pins, as required in the prior art, the length of the communicating path of the electrical signals can be reduced and the contact resistance, too, can be reduced. Consequently, problems such as a delay of the electrical signals and increased noise can be avoided. In addition, the semiconductor packages 700 can be mounted easily at high density to realize a larger capacity.

Furthermore, since the external force applied to the semiconductor package 700 in the seventh embodiment when mounting the semiconductor package 700 at the surface of the substrate 720 is absorbed by the buffer member 714, the semiconductor package 700 and the substrate 720 can be prevented from becoming damaged. Moreover, by attenuating the external force applied to the semiconductor package 700 by absorbing it with the buffer member 714, it becomes possible to electrically connect the individual conductive sleeves 706 to the substrate connector such as a wiring formed at the surface of the substrate 720 with an even force. In addition, since the electrodes 712 of the semiconductor package 700 in the seventh embodiment are connected to the wiring at the surface of the substrate 720, the contact resistance can be further reduced.

Eighth Embodiment

Figure 13A:
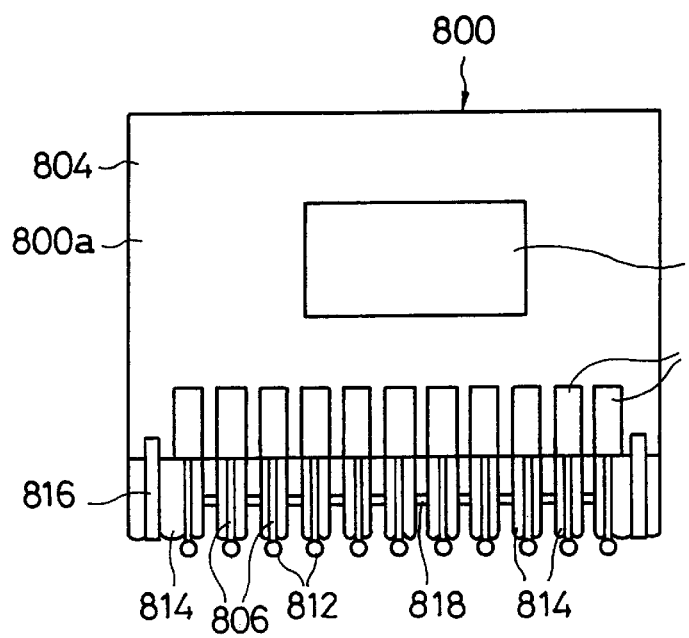
FIG. 13 illustrates an example of the electronic part in a seventh embodiment of the present invention, with FIG. 13(a) presenting a front view of the electronic part, FIG. 13(b) presenting a transverse cross section of the electronic part and FIG. 13(c) presenting a bottom view of the electronic part.
Figure 13B:
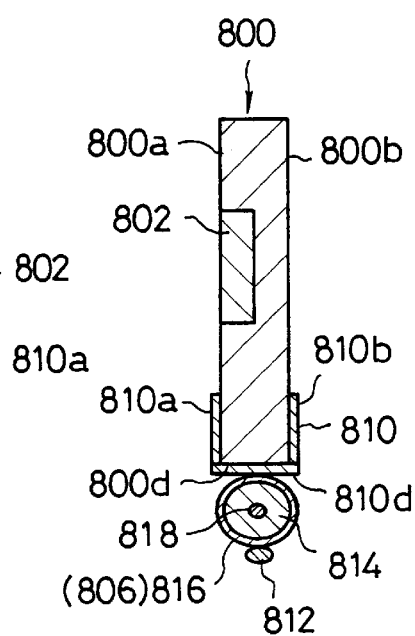
Figure 13C:
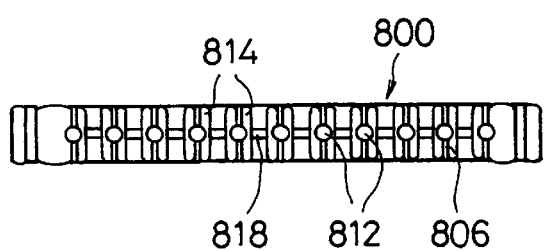
Figure 14:
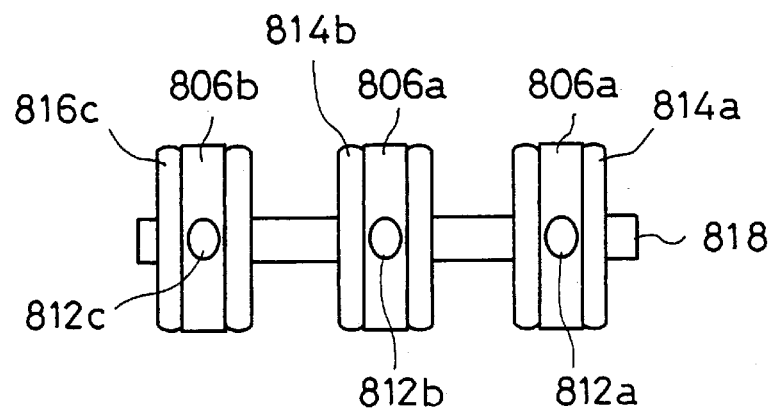
FIG. 14 is an enlargement illustrating the lead structure adopted in the electronic part in the seventh embodiment.
Figure 15:
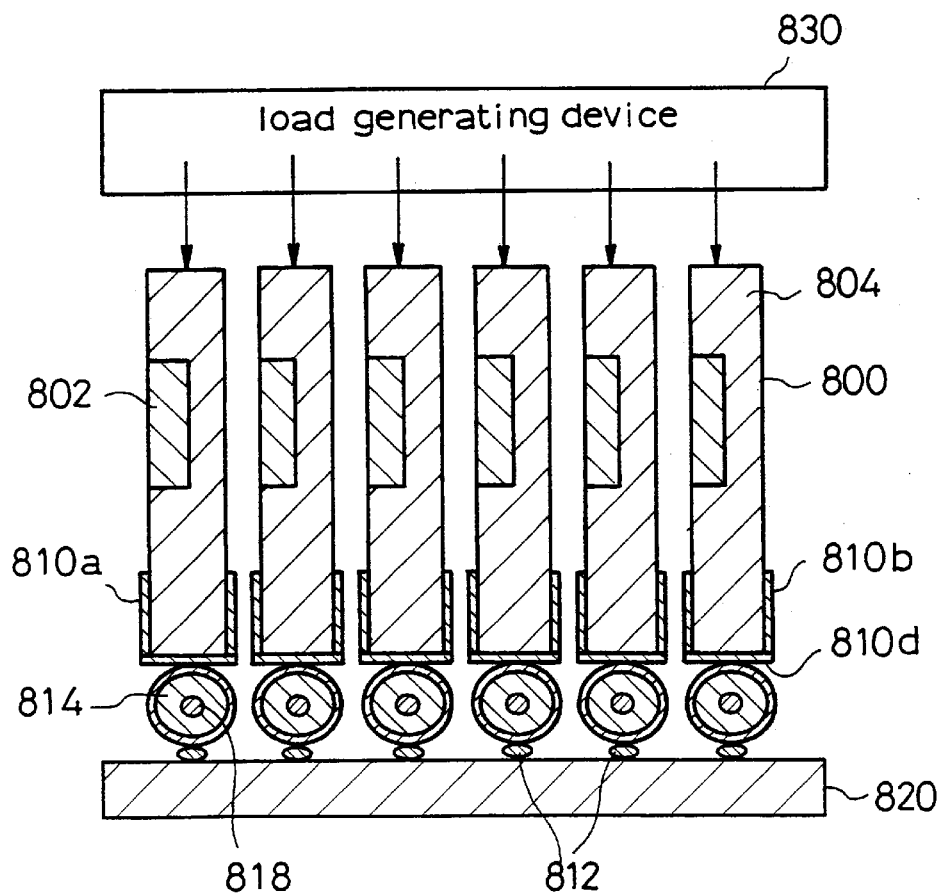
FIG. 15 illustrates a state in which a plurality of the electronic parts in the seventh embodiment are mounted at a substrate surface.

FIG. 13 illustrates a semiconductor package 800 in the eighth embodiment of the present invention, with FIG. 13(*a*)

presenting a front view of the semiconductor package 800, FIG. 13(*b*) presenting a transverse cross section of the semiconductor package 800 and FIG. 13(*c*) presenting a bottom view of the semiconductor package 800. FIG. 14 is an enlargement illustrating the lead structure adopted in the semiconductor package 800 in the eighth embodiment. FIG. 15 illustrates a state in which a plurality of the semiconductor packages 800 in the eighth embodiment are mounted at a surface of a substrate 820.

In this semiconductor package 800, too, as in the semiconductor package 700 in the seventh embodiment explained earlier in reference to FIGS. 11 and 12, a plurality of terminals 810 for inputting and outputting electrical signals for various electronic elements 802 sealed at the semiconductor package 800 with a sealant 804 are provided at a bottom surface 800*d* of the semiconductor package 800. The terminals 810 are each formed in a U shape to cover the lower end 800*d* of the semiconductor package 800 and are each constituted of lateral side portions 810*a* and 810*b* located at large area portions 800*a* and 800*b* respectively of the semiconductor package 800 and a bottom side portion 810*d* that covers the lower end 800*d* of the semiconductor package 800.

In addition, buffer members 814 constituted of an insulating material such as an insulating rubber, a silicone rubber or the like are mounted in close contact by securing fixtures 816 at the bottom surface 800*d* of the semiconductor package 800. The buffer members 814 are constituted by linking a plurality of roughly cylindrical members 814*a*, 814*b* and 814*c* with a mandrel 818 which is provided parallel to the bottom surface 800*d* of the semiconductor package 800 and functions as a reinforcing member, as illustrated in FIG. 14.

At the surface of each buffer member 814 (814*a*, 814*b*, 814*c*), a ring-shaped conductive sleeve 806 (806*a*, 806*b*, 806*c*) which functions as a lead is provided in correspondence to the terminals 810, with a portion of each conductive sleeve 806 electrically connected to the bottom side portion 810*d* of each terminal 810 provided at the bottom surface 800*d* of the semiconductor package 800. The conductive sleeves 806 may be constituted by, for instance, placing and securing a conductive substance such as copper, silver, gold or the like to a flexible insulating substance such as a polyimide tape and pasting this assembly at the external circumference of the individual buffer members 814 (814*a*, 814*b*, 814*c*).

In addition, in the semiconductor package 800 in the eighth embodiment, an electrode 812 (812*a*, 812*b*, 812*c*) is formed to protrude at a side surface of each conductive sleeve 806 as in the semiconductor package 700 in the seventh embodiment explained earlier. This electrode 812 may be achieved by adopting a method in which a portion of the conductive sleeve 806 is mechanically struck outward with a punch or the like, a method in which a conductive substance, (for instance, gold, silver, copper, solder or the like) is placed to adhere at a side surface of the conductive sleeve 806 to form the electrode 812 or the like. It is to be noted that since the other structural features are similar to those in the semiconductor package 100 in the first embodiment, the semiconductor package 600 in the sixth embodiment and the semiconductor package 700 in the seventh embodiment, their detailed explanation is omitted.

The semiconductor package 800 in the eighth embodiment, too, is mounted at the surface of the substrate 820 by applying a downward external force to the semiconductor package 800 to press it against the surface of the substrate 820 with a load generating device 830, with the conductive sleeves 806 directly connected to the substrate connector (not shown) such as a wiring at the surface of the substrate 820, as illustrated in FIG. 15. It is to be noted that during the mounting process, the substrate connector and the individual leads 806 may be bonded using a conductive adhesive to improve stability.

Since this structure makes it possible to mount the semiconductor packages 800 on the substrate without having to employ contact parts including additional parts such as contact pins as required in the prior art, the length of the communicating path of the electrical signals can be reduced and the contact resistance, too, can be reduced. Consequently, problems such as a delay of the electrical signals and increased noise can be avoided. In addition, the semiconductor packages 800 can be mounted easily at high density to realize a larger capacity.

Furthermore, since the external force applied by the load generating device 830 to the semiconductor package 800 when mounting the semiconductor package 800 at the surface of the substrate 820 is absorbed by the buffer members 814 in the semiconductor package 800 in the eighth embodiment, the semiconductor package 800 and the substrate 820 can be prevented from becoming damaged.

In addition, since the semiconductor package 800 in the eighth embodiment adopts a structure in which the electrodes 812 formed at the conductive sleeves 806 are connected to the substrate connector at the surface of the substrate 820, the contact resistance can be further reduced.

Moreover, since the semiconductor package 800 in the eighth embodiment is constituted in such a manner that the separate conductive sleeves 806 (806*a*, 806*b*, 806*c*) are provided at the surfaces of the individual buffer members 814 (814*a*, 814*b*, 814*c*) linked by the reinforcing member 818 to make up pairs with the corresponding buffer members 814 (814*a*, 814*b*, 814*c*) adjacent conductive sleeves 806 (806*a*, 806*b*, 806*c*) are prevented from coming into contact with each other when the semiconductor package 800 is mounted at the surface of the substrate 820 to assure insulation between the individual conductive sleeves 806 (806*a*, 806*b*, 806*c*) with a high degree of reliability.

Furthermore, with the external force applied to the semiconductor package 800 attenuated through absorption at the buffer members 814, it becomes possible to electrically connect the conductive sleeves 806 (806*a*, 806*b*, 806*c*) to the substrate connector at the surface of the substrate 820 with an even force.

Ninth Embodiment

Figure 16A:
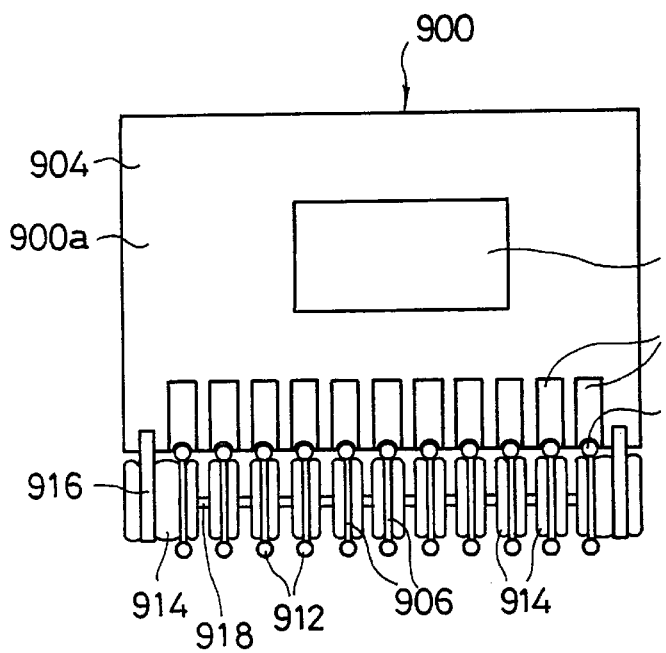
FIG. 16 illustrates an example of the electronic part in an eighth embodiment of the present invention, with FIG. 16(a) presenting a front view of the electronic part, FIG. 16(b) presenting a transverse cross section of the electronic part and FIG. 16(c) presenting a bottom view of the electronic part.
Figure 16B:
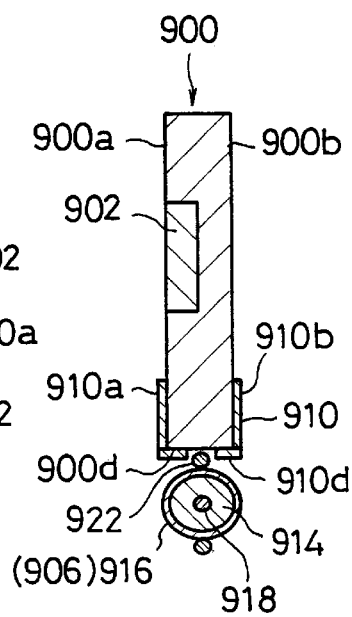
Figure 16C:
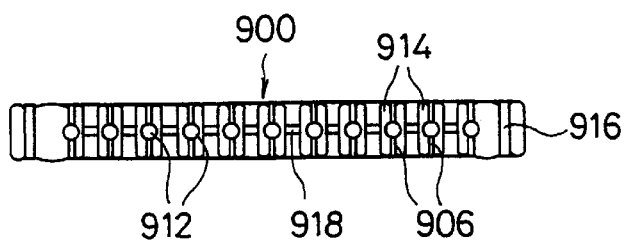
Figure 17:
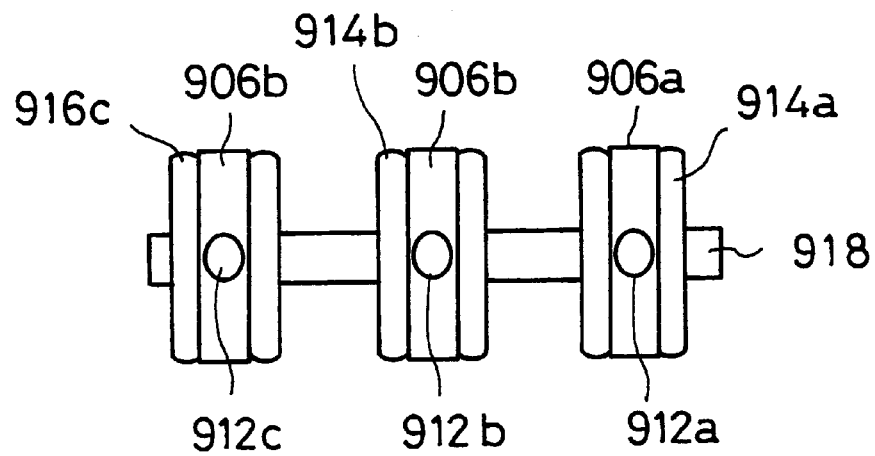
FIG. 17 is an enlargement illustrating the lead structure in the electronic part in the eighth embodiment.
Figure 18:
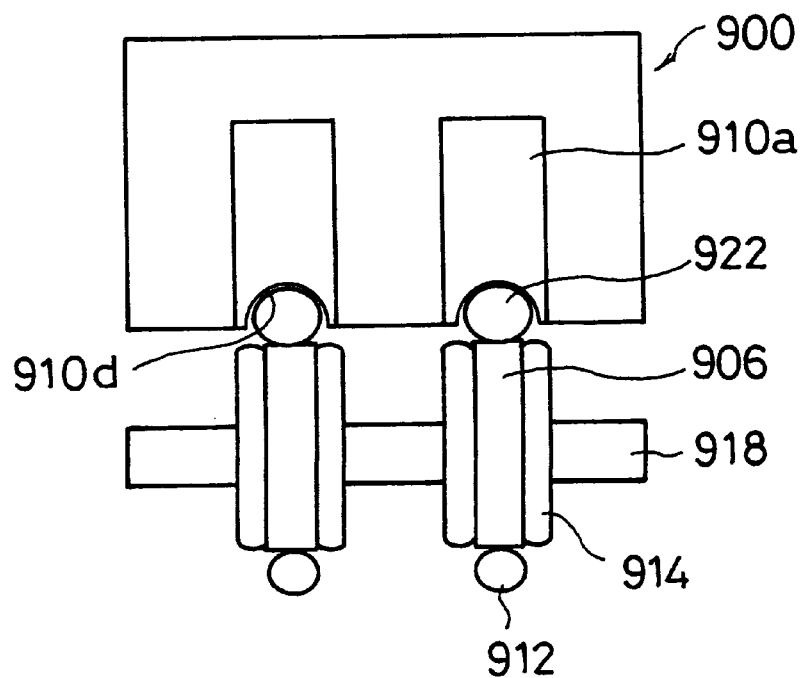
FIG. 18 is an enlargement illustrating the state of connection of the lead structure in the eighth embodiment to the electronic part.
Figure 19:
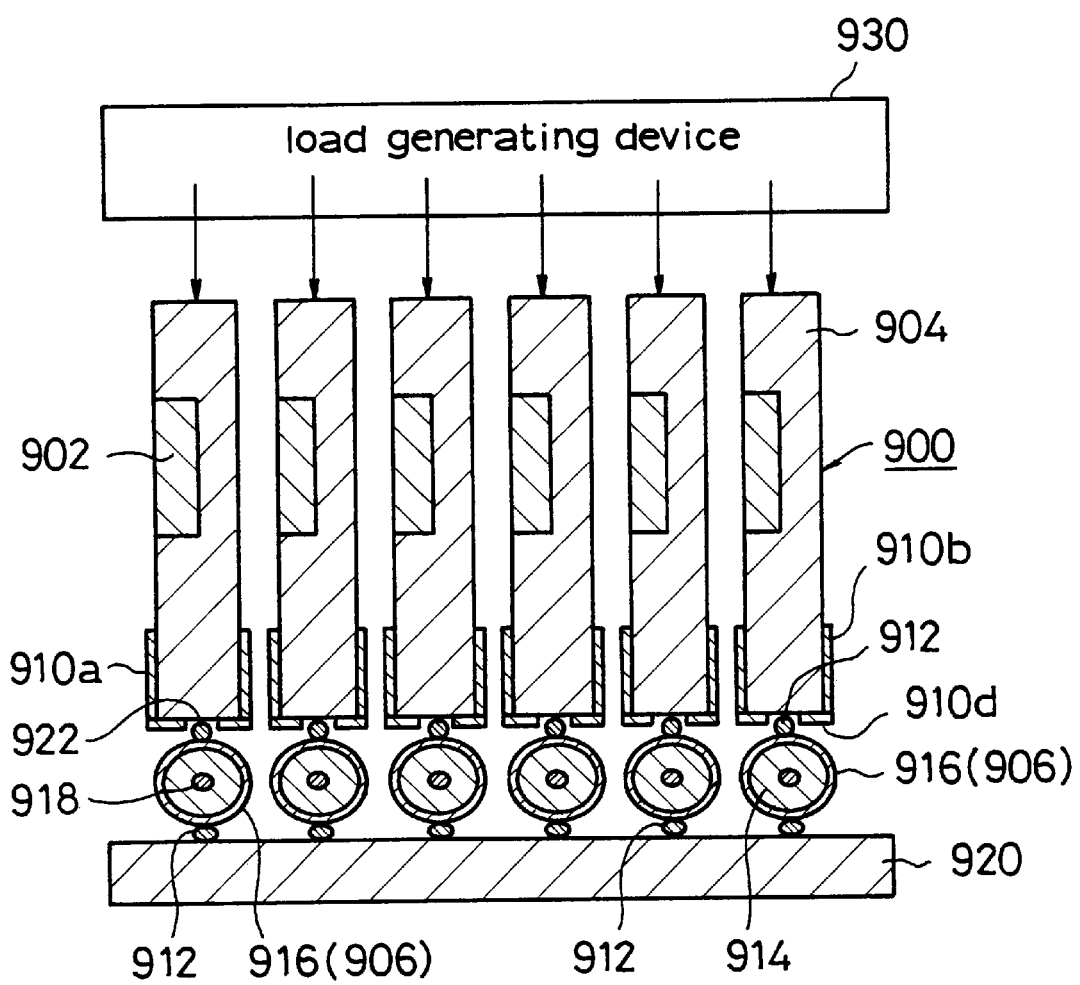
FIG. 19 illustrates a state in which a plurality of the electronic parts in the eighth embodiment are mounted at a substrate surface.

FIG. 16 illustrates a semiconductor package 900 in the ninth embodiment of the present invention, with FIG. 16(*a*) presenting a front view of the semiconductor package 900, FIG. 16(*b*) presenting a transverse cross section of the semiconductor package 900 and FIG. 16(*c*) presenting a bottom view of the semiconductor package 900. FIG. 17 is an enlargement illustrating the lead structure adopted in the semiconductor package 900 in the ninth embodiment. FIG. 18 is an enlargement illustrating a state in which the leads structured as in the ninth embodiment are connected to the semiconductor package 900. FIG. 19 illustrates a state in which a plurality of the semiconductor packages 900 in the ninth embodiment are mounted at a surface of a substrate 920.

In this semiconductor package 900, too, as in the semiconductor packages in the previous embodiments, a plurality of terminals 910 for inputting and outputting electrical signals for various electronic elements 902 sealed at the semiconductor package 900 with a sealant 904 are provided at a bottom surface 900*d* of the semiconductor package 900. The terminals 910 are each formed a U shape to cover the lower end 900d of the semiconductor package 900 in and are each constituted of lateral side portions 910a and 910b located at large area portions 900a and 900b respectively of the semiconductor package 900 and a bottom side portion 910d that covers the lower end 900d of the semiconductor package 900.

In addition, buffer members 914 constituted of an insulating material such as an insulating rubber, a silicone rubber or the like are mounted in close contact by securing fixtures 916 at the bottom surface 900d of the semiconductor package 900. The buffer members 914 are constituted by linking a plurality of roughly cylindrical members 914a, 914b and 914c with a mandrel 918 which is provided parallel to the bottom surface 900d of the semiconductor package 900 and functions as a reinforcing member, as illustrated in FIGS. 17 and 18.

At a surface of each buffer member 914 (914a, 914b and 914c) a ring-shaped conductive sleeve 906 (906a, 906b, 906c) which functions as a lead is provided in correspondence to the terminals 910.

In this embodiment, a portion of each of the conductive sleeves 906 is electrically connected to the bottom side portion 910d of a terminal 910 provided at the bottom surface 900d of the semiconductor package 900 via an almost spherical conductive bonding member 922. It is to be noted that while a recess is formed at the bottom side 910d of the terminal 910 to enhance the adhesive property of the bonding member 922 as illustrated in FIG. 18, it goes without saying that such a recess may be omitted.

The conductive sleeves 906 may be constituted by, for instance, placing and securing a conductive substance such as copper, silver, gold or the like to a flexible insulating substance such as a polyimide tape and pasting this assembly at the external circumferences of the individual buffer members 914 (914a, 914b, 914c).

In addition, in the semiconductor package 900 in the ninth embodiment, an electrode 912 (912a, 912b, 912c) is formed to protrude at a side surface of each conductive sleeve 906 as in the semiconductor packages 700 and 800 in the previous embodiments explained earlier. The electrode 912 (912a, 912b, 912c) may be achieved by adopting a method in which a portion of the conductive sleeve 906 is mechanically struck outward with a punch or the like, a method in which a conductive substance, (for instance, gold, silver, copper, solder or the like) is placed to adhere at the side surface of the conductive sleeve 906 to form the electrode 912, or the like. It is to be noted that since the other structural features are similar to those in the semiconductor packages in the previous embodiments, their detailed explanation is omitted.

The semiconductor package 900 in the ninth embodiment, too, is mounted at the surface of the substrate 920 by applying a downward external force to the semiconductor package 900 to press it against the surface of the substrate 920 with a load generating device 930, with the conductive sleeves 906 directly connected to the substrate connector (not shown) such as a wiring at the surface of the substrate 920, as illustrated in FIG. 19. It is to be noted that during the mounting process, the substrate connector and the individual leads 906 may be bonded using a conductive adhesive to improve stability.

Since this structure makes it possible to mount the semiconductor package 900 on the substrate without having to employ contact parts including additional parts such as contact pins as required in the prior art, the length of the communicating path of the electrical signals can be reduced and the contact resistance, too, can be reduced. Consequently, problems such as a delay of the electrical signals and increased noise can be avoided. In addition, the semiconductor package 900 can be mounted easily at high density to realize a larger capacity.

Also, since the external force applied by the load generating device 930 to the semiconductor package 900 in the ninth embodiment when mounting the semiconductor package 900 at the surface of the substrate 920 is absorbed by the buffer members 914, the semiconductor package 900 and the substrate 920 can be prevented from becoming damaged.

In addition, since the semiconductor package 900 in the ninth embodiment adopts a structure in which the electrodes 912 formed at the conductive sleeves 906 are connected to the substrate connector at the surface of the substrate 920, the contact resistance can be further reduced.

Furthermore, since the semiconductor package 900 in the ninth embodiment is constituted in such a manner that the separate conductive sleeves 906 (906a, 906b, 906c) are provided at the surfaces of the individual buffer members 914 (914a, 914b, 914c) linked by the reinforcing member 918 to make up pairs with the corresponding buffer members 914 (914a, 914b, 914c), adjacent conductive sleeves 906 (906a, 906b, 906c) are prevented from coming into contact with each other when the semiconductor package 900 is mounted at the surface of the substrate 920 to assure insulation between the individual conductive sleeves 906 (906a, 906b, 906c) with a high degree of reliability.

Moreover, with the external force applied to the semiconductor package 900 attenuated through absorption at the buffer members 914, it becomes possible to electrically connect the conductive sleeves 906 (906a, 906b, 906c) to the substrate connector at the surface of the substrate 920 with an even force.

In addition, with the semiconductor package 900 in the ninth embodiment, since the conductive sleeves 906 are each connected to the corresponding terminal 910 (910d) via the bonding member 922, the contact resistance can be further reduced. It is to be noted that by adopting a structure in which the conductive sleeves 906 and the terminals 910 (the terminal bottom portions 910d) are connected by employing such bonding members 922, it also becomes possible to directly connect the terminals 910 (the terminal bottom portions 910d) at through holes formed at the semiconductor packages 900, for instance.

Tenth Embodiment

Figure 20A:
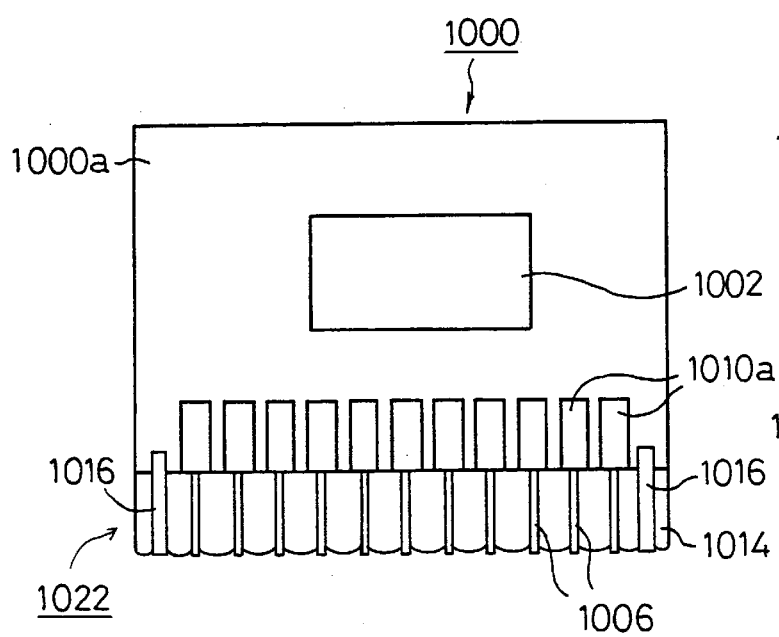
FIG. 20 illustrates an example of the electronic part in a ninth embodiment of the present invention, with FIG. 20 (a) presenting a front view of the electronic part, FIG. 20(b) presenting a transverse cross section of the electronic part and FIG. 20(c) presenting a bottom view of the electronic part.
Figure 20B:
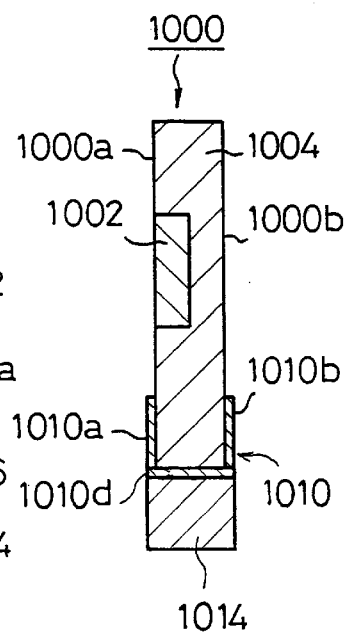
Figure 20C:
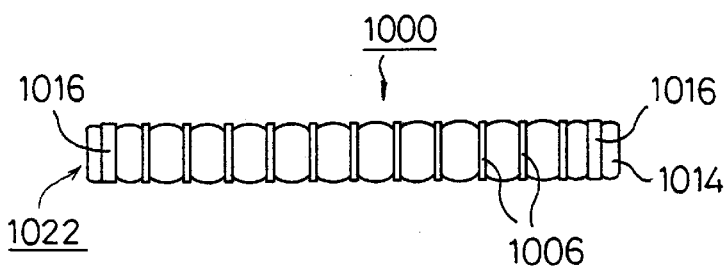
Figure 21:
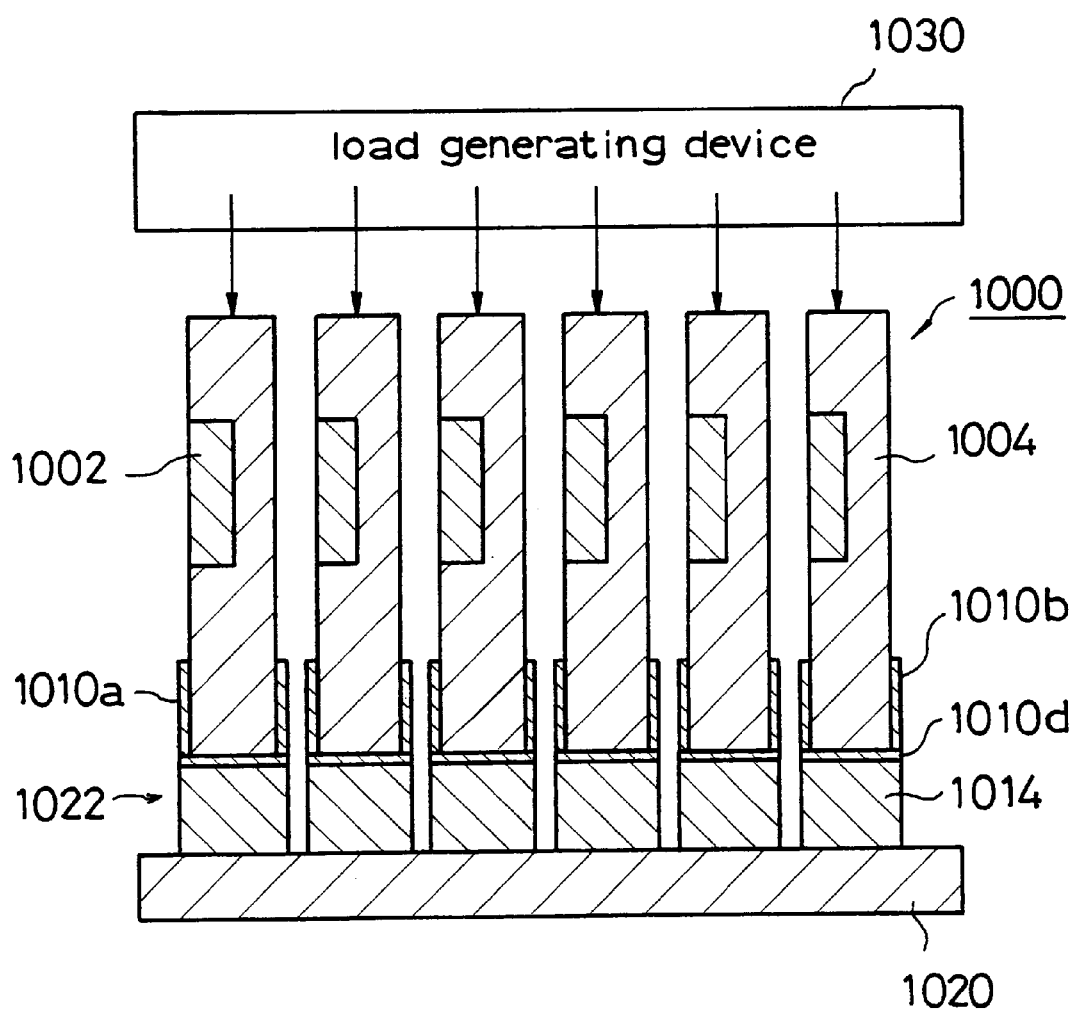
FIG. 21 illustrates a state in which a plurality of the electronic parts in the ninth embodiment are mounted at a substrate surface.

FIG. 20 illustrates a semiconductor package 1000 in the tenth embodiment of the present invention, with FIG. 20(a) presenting a front view of the semiconductor package 1000, FIG. 20(b) presenting a transverse cross section of the semiconductor package 1000 and FIG. 20(c) presenting a bottom view of the semiconductor package 1000. FIG. 21 illustrates a state in which a plurality of the semiconductor packages 1000 in the tenth embodiment are mounted at a surface of a substrate 1020.

In this semiconductor package 1000, too, as in the semiconductor packages in the previous embodiments, a plurality of terminals 1010 for inputting and outputting electrical signals for various electronic elements 1002 sealed at the semiconductor package 1000 with a sealant 1004 are provided at a bottom surface 1000d of the semiconductor package 1000. The terminals 1010 are each formed in a U shape to cover the lower end 1000d of the semiconductor package 1000 and are each constituted of lateral side portions 1010a and 1010b located at large area portions 1000a and 1000b respectively of the semiconductor package 1000 and a bottom side portion 1010d that covers the lower end 1000d of the semiconductor package 1000.

In addition, at the bottom surface 1000d of the semiconductor package 1000, a roughly cylindrical laminated structure 1022 constituted by clamping a plurality of conductive layers 1006 in an insulating buffer member 1014 which is constituted of an insulating material such as an insulating rubber, a silicone rubber or the like, is mounted in close contact by securing fixtures 1016.

This laminated structure 1022 is constituted by embedding a conductive layer films 1006 constituted of a conductive substance such as aluminum, gold, silver or the like inside the buffer member 1014 constituted of an insulating substance. The individual conductive layers 1006 are provided at positions that will correspond to the bottom portions 1010d of the individual terminals 1010 when mounted. Thus, the conductive layers 1006 are each constituted in such a manner that it becomes exposed from the surface of the buffer member 1014 during the mounting process with one end thereof electrically connected to one of the terminals 1010 provided at the bottom surface 1000d of the semiconductor package 1000 and the other end thereof electrically connected to the substrate connector at the substrate 1020.

The semiconductor package 1000 in the tenth embodiment, too, is mounted at the surface of the substrate 1020 by applying a downward external force to the semiconductor package 1000 to press it against the surface of the substrate 1020 with a load generating device 1030, with the conductive layers 1016 enclosed in the buffer member 1014 directly connected to the substrate contact at the surface of the substrate 1020, as illustrated in FIG. 21. It is to be noted that during the mounting process, the substrate connector and the individual leads 1006 may be bonded using a conductive adhesive to improve stability.

Since this structure makes it possible to mount the semiconductor packages 1000 on the substrate without having to employ contact parts including additional parts such as contact pins as required in the prior art, the length of the communicating path of the electrical signals can be reduced and the contact resistance, too, can be reduced. Consequently, problems such as a delay of the electrical signals and increased noise can be avoided. In addition, the semiconductor packages 1000 can be mounted easily at high density to realize a larger capacity.

Furthermore, since the external force applied by the load generating device 1030 to the semiconductor package 1000 in the tenth embodiment when mounting the semiconductor package 1000 at the surface of the substrate 1020 is absorbed by the buffer member 1014 in the semiconductor package 1000 and the substrate 1020 can be prevented from becoming damaged. Moreover, with the external force applied to the semiconductor package 1000 attenuated through absorption at the buffer member 1014, it becomes possible to electrically connect the conductive layers 1016 to the substrate connector such as a wiring formed at the surface of the substrate 1020 with an even force.

Eleventh Embodiment

Figure 22A:
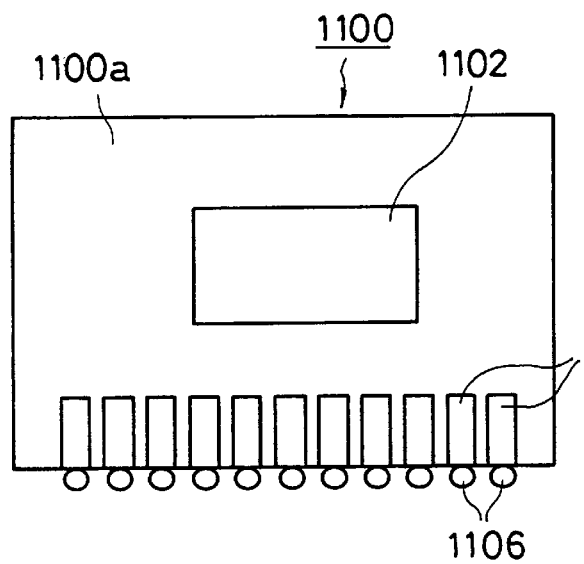
FIG. 22 illustrates an example of the electronic part in a tenth embodiment of the present invention, with FIG. 22(a) presenting a front view of the electronic part, FIG. 22(b) presenting a transverse cross section of the electronic part and FIG. 22(c) presenting a bottom view of the electronic part.
Figure 22B:
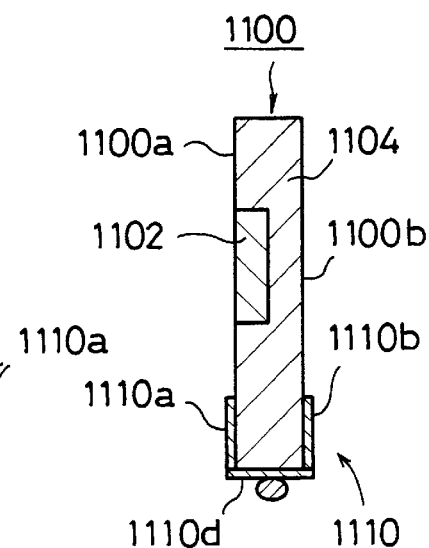
Figure 22C:
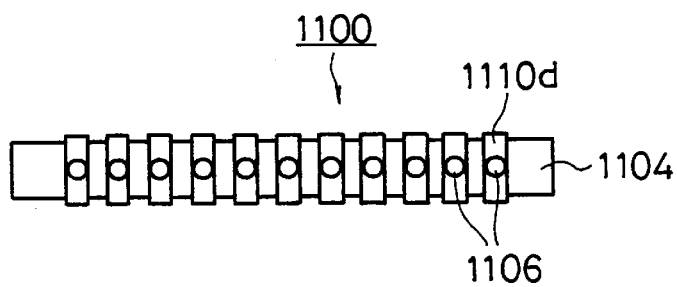
Figure 23:
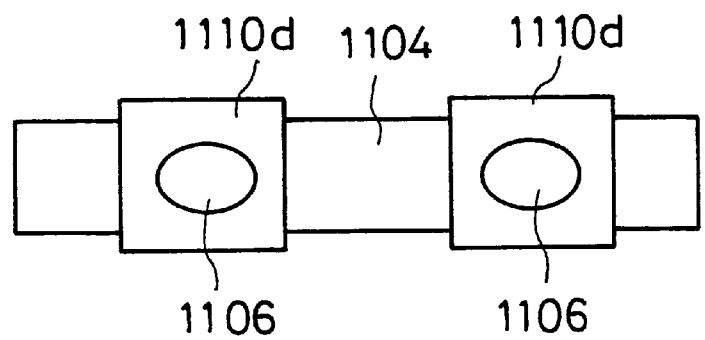
FIG. 23 is an enlargement illustrating the lead structure in the electronic part in the tenth embodiment.
Figure 24:
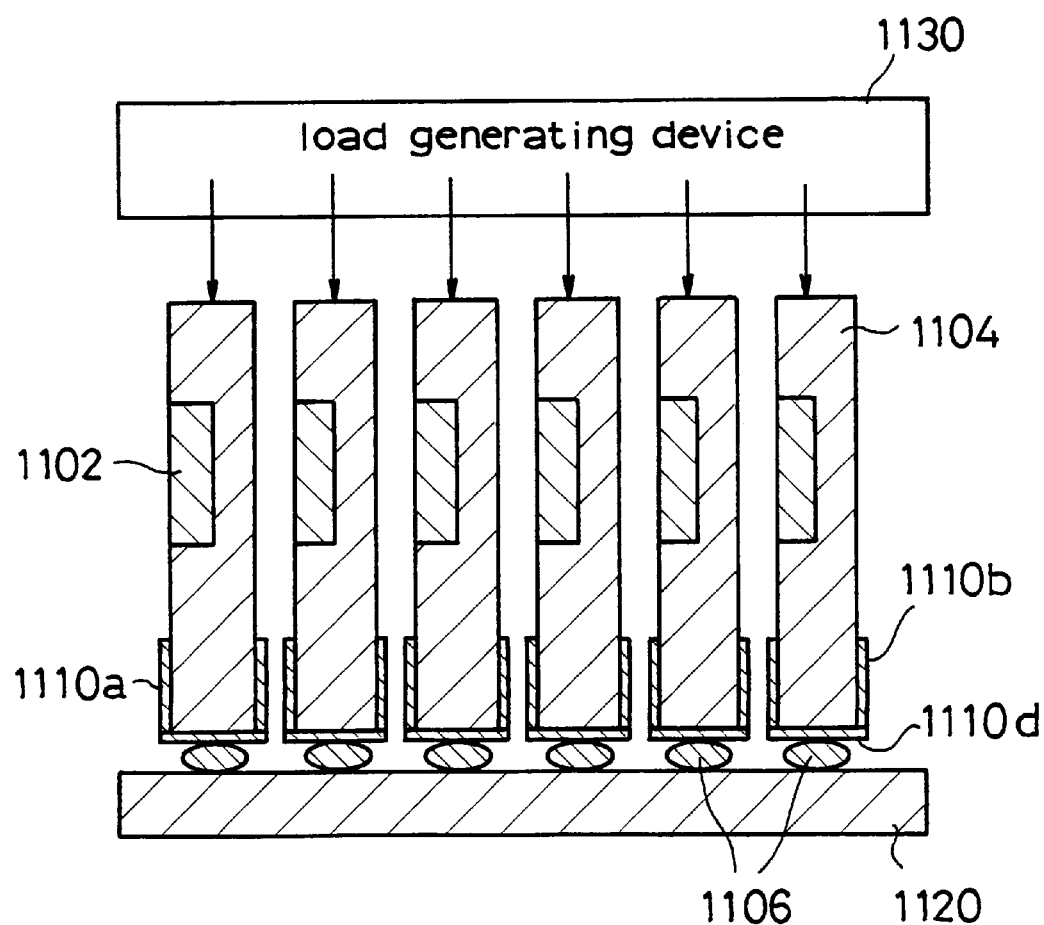
FIG. 24 illustrates a state in which a plurality of the electronic parts in the tenth embodiment are mounted at a substrate surface.

FIG. 22 illustrates a semiconductor package 1100 in the eleventh embodiment of the present invention, with FIG. 22(a) presenting a front view of the semiconductor package 1100, FIG. 22(b) presenting a transverse cross section of the semiconductor package 1100 and FIG. 22(c) presenting a bottom view of the semiconductor package 1100. FIG. 23 is an enlargement illustrating the lead structure adopted in the semiconductor package 1100 in the eleventh embodiment. FIG. 24 illustrates a state in which a plurality of the semiconductor packages 1100 in the eleventh embodiment are mounted at a surface of a substrate 1120.

In this semiconductor package 1100, too, as in the semiconductor packages in the previous embodiments, a plurality of terminals 1110 for inputting and outputting electrical signals for various electronic elements 1102 sealed at the semiconductor package 1100 with a sealant 1104 are provided at a bottom surface 1100d of the semiconductor package 1100. The terminals 1110 are each formed in a U shape to cover the lower end 1100d of the semiconductor package 1100 and are each constituted of lateral side portions 1110a and 1110b located at large area portions 1100a and 1100b respectively of the semiconductor package 1100 and a bottom side portion 1110d that covers the lower end 1100d of the semiconductor package 1100.

In addition, in this embodiment, roughly spherical electrodes 1106 that function as leads are directly provided at the bottom portions 1110d of the terminals 1100. The lead electrodes 1106 may each be formed by employing a method in which a portion of the bottom side portion 1110d of the terminal 1110 is mechanically struck outward with a punch or the like or by employing a method in which a conductive substance (silver, gold, copper, solder or the like, for instance) is bonded to the bottom side portion 1110d of the terminal 1110 to form the electrode 1106. It is to be noted that since other structural features are similar to those in the semiconductor packages explained earlier, their detailed explanation is omitted.

The semiconductor package 1100 in the eleventh embodiment, too, is mounted at the surface of the substrate 1120 by applying a downward external force to the semiconductor package 1100 to press it against the surface of the substrate 1120 with a load generating device 1130, with the electrodes 1106 functioning as leads directly connected to the substrate connector (not shown) such as a wiring at the surface of the substrate 1120, as illustrated in FIG. 24. It is to be noted that during the mounting process, the substrate connector and the individual leads 1106 may be bonded using a conductive adhesive to improve stability.

Since this structure makes it possible to mount the semiconductor package 1100 on the substrate without having to employ contact parts including additional parts such as contact pins as required in the prior art, the length of the communicating path of the electrical signals can be reduced and the contact resistance, too, can be further reduced. Consequently, problems such as a delay of the electrical signals and increased noise can be avoided to the maximum degree. In addition, the semiconductor package 1100 can be mounted easily at high density to realize a larger capacity.

Twelfth Embodiment

Figure 26:
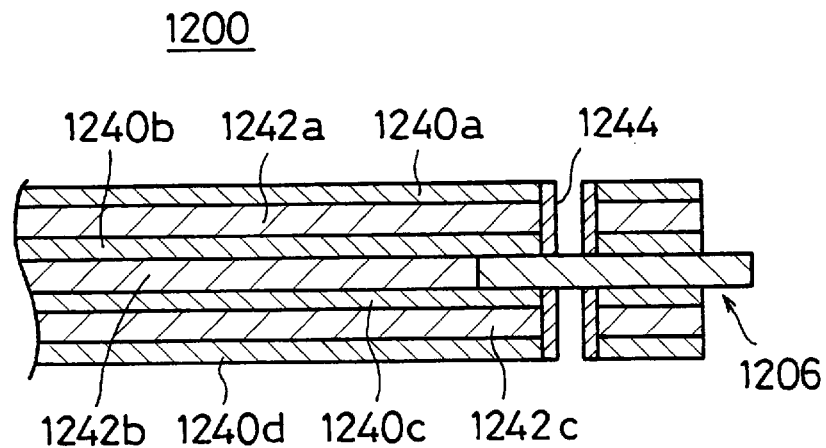
FIG. 26 is an enlargement illustrating the lead structure in the electronic part in the eleventh embodiment.
Figure 27:
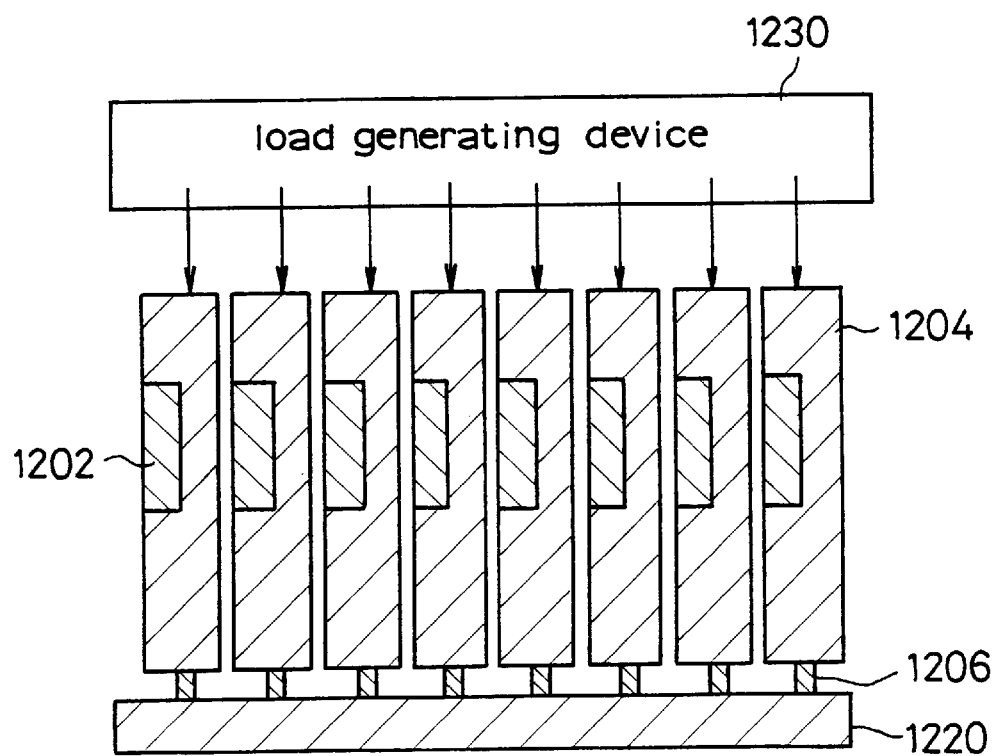
FIG. 27 illustrates a state in which a plurality of electronic parts in the eleventh embodiment are mounted at a substrate surface.
Figure 28B:
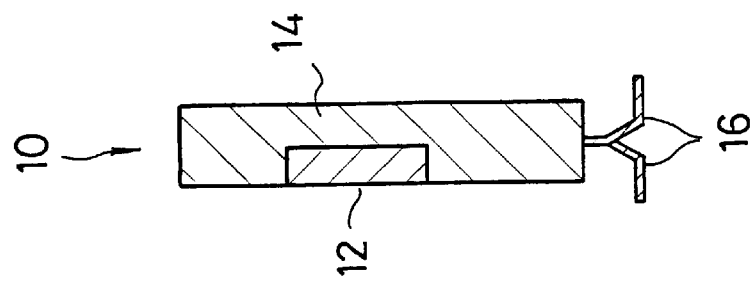
FIG. 28 illustrates an electronic part in the prior art, with FIG. 28(a) presenting a front view of the electronic part and FIG. 28(b) presenting a transverse cross section of the electronic part.
Figure 28A:
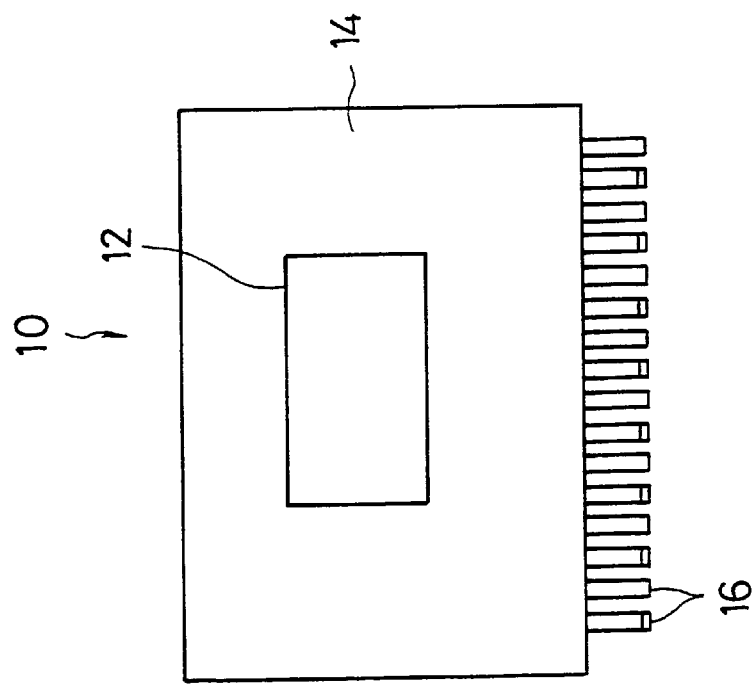
Figure 29:
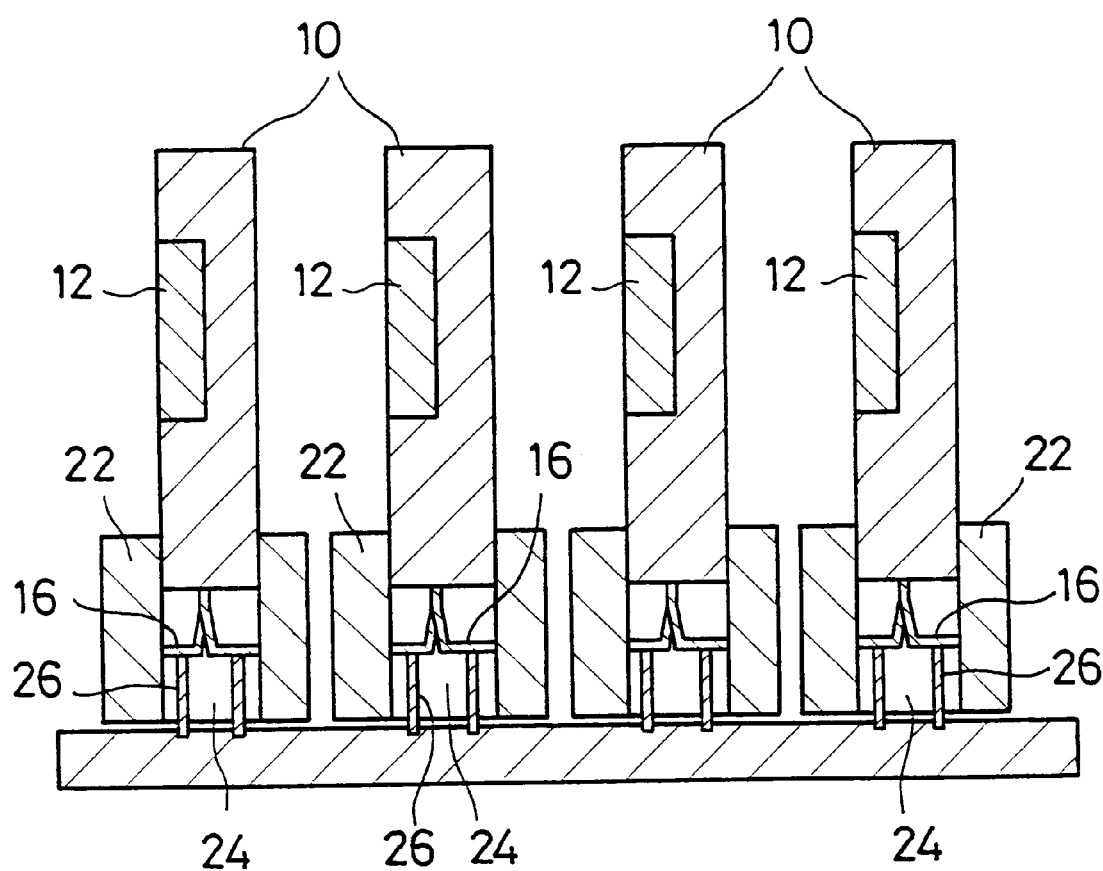
FIG. 29 illustrates a state in which a plurality of the electronic parts in the prior art are mounted at a substrate surface.

FIG. 25 illustrates a semiconductor package 1200 in the twelfth embodiment of the present invention, with FIG. 25(a) presenting a front view of the semiconductor package 1200, FIG. 25(b) presenting a transverse cross section of the semiconductor package 1200 and FIG. 25(c) presenting a bottom view of the semiconductor package 1200. FIG. 26 is an enlarged cross section illustrating the lead structure adopted in the semiconductor package 1200 in the twelfth embodiment. FIG. 27 illustrates a state in which a plurality of the semiconductor packages 1200 in the twelfth embodiment are mounted at a surface of a substrate 1220.

As illustrated in FIG. 26, various electronic elements 1202 are sealed with an appropriate sealant 1204 at the semiconductor package 1200. As illustrated in FIG. 26, the semiconductor package 1200 is constituted by adopting a multilayer structure, with conductive wiring pattern layers 1240a, 1240b, 1240c and 1240d laminated via insulating adhesive layers 1242a, 1242b, 1242c and 1242d. In addition, through hole 1244 is formed at an appropriate position at the semiconductor package 1200 to electrically connect the individual conductive wiring pattern layers 1240a, 1240b, 1240c and 1240d with one another.

Furthermore, reference number 1206 indicates a conductive electrode which functions as a lead and is applied between specific layers between the wiring pattern layer 1240b and the wiring pattern layer 1240c in the example presented in the figure when the individual layers in the semiconductor package achieving a multilayer structure undergo thermal compression bonding. The electrode 1206 is placed in such a manner that its one end reaches the through hole 1244 while a portion of the other end projects out through the exterior of the semiconductor package 1200. It is desirable that the electrode 1206 have a degree of elasticity as well as a conductive property, and it may be constituted of, for instance, a probe, a spring needle or the like.

The semiconductor package 1200 in the twelfth embodiment, too, can be mounted at the surface of the substrate 1220 by applying a downward external force to press it against the surface of the substrate 1220, with the leads 1206 mounted at the surface of the substrate 1220 by applying a downward external force to press it against the surface of the substrate 1220 to directly connect the leads 1206 to the wiring at the surface of the substrate 1220. It is to be noted that during the mounting process, the substrate connector and the individual leads 1206 may be made to adhere to each other using a conductive adhesive to increase stability.

Since this structure makes it possible to mount the semiconductor packages 1200 on the substrate without having to employ contact parts including additional parts such as contact pins as required in the prior art, the length of the communicating path of the electrical signals can be reduced and the contact resistance, too, can be reduced. Consequently, problems such as a delay of the electrical signals and increased noise can be avoided. In addition, the semiconductor package 1200 can be mounted easily at high density to realize a larger capacity.

Furthermore, since the external force applied by the load generating device 1230 to the semiconductor package 1200 in the twelfth embodiment when mounting the semiconductor package 1200 at the surface of the substrate 1220 is absorbed by the elastic leads 1206, the semiconductor package 1200 and the substrate 1220 can be prevented from becoming damaged. Moreover, with the external force applied to the semiconductor package 1200 attenuated through absorption at the elastic leads 1206, it becomes possible to electrically connect the individual leads 1206 to the substrate connector at the surface of the substrate 1220 with an even force.

As has been explained, by adopting the lead structure according to the present invention, the length of the communicating path of the electrical signals can be reduced and the contact resistance can be minimized. Consequently, delay of the electrical signals and noise can be reduced.

While detailed explanation has been even on the mounting structure for electronic parts according to the present invention by referring to the attached drawings, the present invention is not limited to these examples and it will be understood by those skilled in the art that various changes in form and detail may be made therein without departing from the spirit, scope and teaching of the invention and that they too belong within the technical scope of the present invention.

For instance, while the explanation has been given on examples in which the present invention is adopted in SVP (Surface Vertical Package) semiconductor packages in reference to the embodiments, the present invention may also be adopted in all types of semiconductor devices including SOP (Small Outline Package) and T-SOP (Thin Small Outline Package) devices.

In addition, while examples in which the present invention is adopted in the SVP type semiconductor packages are presented in the embodiments explained above, the present invention is not limited to application in such semiconductor packages, and may be adopted when mounting various types of electronic parts that are achieved through packaging various types of electronic elements which are electrically operated, including circuit elements such as resistors and capacitors or optical elements such as light modulators, laser diodes and light amplifiers and sealing them with a resin at a substrate.

Furthermore, while the explanation has been given in reference to the embodiments on examples in which a load generating device such as a jig is employed as a securing device for securing the leads to the substrate contact, the securing device that may be employed according to the present invention is not limited to the load generating device employed in the examples, and any structure through which leads and a substrate contact can be electrically connected and secured in a stable manner may be employed. As a securing device, the leads and the substrate contact may be connected using a conductive adhesive, or a load generating device and a conductive adhesive may be employed in combination.

The entire disclosure of Japanese Patent Application No. 9-189182 filed on Jun. 30, 1997 including specification, claims, drawings and summary is incorporated herein by reference in its entirety.

What is claimed is:

1. A mounting structure, comprising:
   a substrate;
   an electronic part;
   a substrate connector formed at a surface of said substrate;
   electronic part connectors formed at a surface of said electronic part;
   a plurality of leads that are electrically connected to said electronic part connectors, said leads each being a roughly U-shaped conductor having two end portions electrically connected to respective electronic part connectors; and
   a securing device that secures said leads to said substrate connector through a pressing force;
   wherein said U-shaped leads and said substrate connector are bonded to each other by a conductive bonding member.

2. A mounting structure according to claim 1, wherein:
   said U-shaped leads are each provided with a protruding electrode at a surface thereof which comes in contact with said substrate connector.

3. A mounting structure according to claim 1, wherein:
   one or more insulating buffer members are provided between said U-shaped leads and said surface of said electronic part.

4. A mounting structure, comprising:
   a substrate;
   an electronic part;
   a substrate connector formed at a surface of said substrate;
   electronic part connectors formed at a surface of said electronic part;
   a plurality of leads that are electrically connected to said electronic part connectors, said leads each being a roughly U-shaped conductor having two end portions electrically connected to respective electronic part connectors; and a securing device that secures said leads to said substrate connector by exerting a pressing force from an electronic part side in a direction toward the substrate.

5. A mounting structure according to claim 4, wherein said U-shaped leads and said substrate connector are bonded to each other by a conductive bonding member.

6. A mounting structure according to claim 5, wherein:

said U-shaped leads are each provided with a protruding electrode at a surface thereof which comes in contact with said substrate connector.

7. A mounting structure according to claim 4, wherein:

said U-shaped leads are each provided with a protruding electrode at a surface thereof which comes in contact with said substrate connector.

8. The mounting structure as recited in claim 4, wherein said electronic part comprises a semiconductor package having two major surfaces and a plurality of contiguous minor surfaces separating the major surfaces and constituting an edge of the semiconductor package;

wherein said electronic part connectors are respectively formed at the two major surfaces;

wherein said U-shaped conductor has a base portion that is adjacent to the edge of the semiconductor package with the two end portions of said U-shaped conductor being connected to the electronic part connectors at the respective two major surfaces; and wherein said securing device exerts the pressing force in a direction essentially parallel to the two major surfaces and against a first portion of the edge of the semiconductor package to press an opposite second portion of the edge of the semiconductor package toward the substrate, so that the base portion of the U-shaped conductor connects with said substrate connector.

* * * * *